United States Patent [19]
Fukui et al.

[11] Patent Number: 5,185,283
[45] Date of Patent: Feb. 9, 1993

[54] METHOD OF MAKING MASTER SLICE TYPE INTEGRATED CIRCUIT DEVICE

[75] Inventors: Yuko Fukui, Otsu; Katsuhiro Ohtani; Hiroyuki Miyamoto, both of Kyoto; Masao Nishiura, Takatsuki; Moriyuki Chimura, Kyoto, all of Japan

[73] Assignee: Matsushita Electronics Corporation, Osaka, Japan

[21] Appl. No.: 666,452

[22] Filed: Mar. 4, 1991

Related U.S. Application Data

[62] Division of Ser. No. 259,521, Oct. 13, 1988, abandoned.

[30] Foreign Application Priority Data

| Oct. 22, 1987 | [JP] | Japan | 62-267065 |
| Oct. 22, 1987 | [JP] | Japan | 62-267066 |
| Oct. 22, 1987 | [JP] | Japan | 62-267067 |
| Oct. 30, 1987 | [JP] | Japan | 62-276214 |
| Jun. 13, 1988 | [JP] | Japan | 62-145156 |

[51] Int. Cl.⁵ .......................... H01L 21/70
[52] U.S. Cl. ..................... 437/51; 437/41; 437/42; 437/45; 437/195
[58] Field of Search ............... 437/48, 51, 195; 357/45, 41, 42; 307/465, 468, 469, 482, 495; 364/490

[56] References Cited

U.S. PATENT DOCUMENTS

| H512 | 8/1988 | Borgini et al. |
| 3,365,707 | 1/1968 | Mayhew |
| 3,638,202 | 1/1972 | Schroeder |
| 3,749,614 | 7/1973 | Boleky, III et al. |
| 4,016,016 | 4/1977 | Ipri |
| 4,161,662 | 7/1979 | Malcolm et al. |
| 4,197,555 | 4/1980 | Uehara et al. |
| 4,507,852 | 4/1985 | Karulkar | 437/195 |
| 4,568,961 | 2/1986 | Noto |
| 4,638,400 | 1/1987 | Brown et al. | 437/195 |
| 4,682,202 | 7/1987 | Tanizawa | 307/465 |
| 4,783,692 | 11/1988 | Uratani | 357/42 |
| 4,800,176 | 1/1989 | Kakamu et al. | 437/195 |

FOREIGN PATENT DOCUMENTS

| 0210397 | 2/1987 | European Pat. Off. |
| 57-79647 | 5/1982 | Japan |
| 57-160144 | 10/1982 | Japan |
| 58-51537 | 3/1983 | Japan |
| 60-224243 | 11/1985 | Japan |

*Primary Examiner*—Tom Thomas
*Attorney, Agent, or Firm*—Wenderoth, Lind & Ponack

[57] ABSTRACT

This invention is to realize a final circuit by wiring only the top layer depending on the individual circuits, by fabricating a master slice in the step of up to forming plural semiconductor elements such as transistors on a semiconductor substrate, forming a lower layer of versatile wiring pieces thereon, and forming contact holes thereon. In this way, since the step just before formation of the top layer wiring can be carried out regardless of the features of individual circuits, preliminary mass productions are possible, and final products can be completed only by forming the wiring of the top layer depending on the requirements of the users. Accordingly, it is applicable to a wide variety of products, and the term for development and manufacture can be tremendously shortened.

5 Claims, 21 Drawing Sheets

METHOD OF MAKING MASTER SLICE TYPE INTEGRATED CIRCUIT DEVICE

This application is a division of now abandoned application Ser. No. 07/259,521 filed on Oct. 13, 1988 now abandoned.

BACKGROUND OF THE INVENTION

This invention relates to master slice type integrated circuit device and manufacturing method thereof for mutually wiring plural logic function cells depending on the required circuit configuration by preparing multiple logic function cells integrated on a semiconductor substrate as a so-called master slice.

As the number of integrated transistors in a semiconductor device increases, the semiconductor processing technology becomes complicated, and a longer period is needed for production. In the layout design, on the other hand, the computer aided design (CAD) apparatus has been employed in order to cope with the complicated layout processing, and wiring is being automated. A conventional semiconductor device is shown in FIG. 4, in which plural logic function cells 2, 3 are formed on a semicondutor substrate 1, and these logic function cells 2, 3 are connected by a wiring group 4. When connecting such two or more logic functions 2, 3 by wiring, it is sometimes necessary to connect a terminal 2a of one logic function cell 2 and a terminal 3a of the other logic function cell 3, or to connect a terminal 2b of one logic function cell 2 and a terminal 3b of the other logic function cell 3. At this time, crossing parts occur in the wirings to connect between terminals 2a and 3a, and 2b and 3b.

In the prior art, accordingly, a two-layer wiring is used as wiring group 4. That is, a first layer wirings 5, 6 are formed at the positions indicated by broken line in FIG. 4, and an insulation layer 7 is formed on them, and a contact hole 7a is formed in this insulation layer 7, and second layer wirings 8, 9, 19, 11 are formed at the positions indicated by solid line on the insulation layer 7, and part of them is connected to the first layer wirings 5, 6 by way of the contact hole 7a. Thus, the two logic function cells 2, 3 are connected by two layers of wiring, and the crossing part A does not cause any inconvenience because the first layer wiring 6 and second layer wiring 10 are insulated by the insulation layer 7.

In this conventional wiring method, however, at least three steps are needed until completion of wiring, that is, processing of first layer wiring, forming of contact hole in insulation layer, and processing of second layer wiring. Therefore, if the CAD should be employed, the wiring process cannot be shortened, and the term of development after completion of logic design cannot be shortened.

SUMMARY OF THE INVENTION

It is hence a primary object of this invention to present master slice type integrated circuit device and manufacturing method thereof capable of solving the above-discussed problems.

To achieve the above object, this invention is to form plural first wiring pieces at specified intervals on a semiconductor substrate on which plural diffusion regions are formed, prepare a master slice by finishing a first step for forming plural contact holes in an insulation layer on the plural first wiring pieces, and form a second layer wiring on the insulation layer according to the required individual circuit configuration, connect this second layer wiring to the first layer wiring pieces through desired contact holes, then connect the plural diffusion regions by way of the first layer wiring pieces and second layer wiring.

This invention is also intended to form two or more layers of wiring pieces on a semiconductor substrate in the same step as stated above, connect these wiring pieces through contact holes to prepare as a master slice, and form only one layer of wirings on the uppermost layer of the insulation layer according to the required individual circuit configuration, connect this uppermost layer wirings to the wiring pieces just beneath the uppermost layer of the insulation layer through contact holes, then connect the plural diffusion regions by the wiring of the uppermost layer and wiring pieces of multiple layers.

According to this invention, since the processing up to the step of forming contact holes in the insulation layer on the wiring pieces can be commonly carried out on all circuits, mass production is possible. Furthermore, the processing for realizing individual circuits on a semiconductor substrate is finished only by wiring of one layer after the above step, so that the term of development may be greatly shortened.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1 to FIG. 4 are drawings to explain a first embodiment of this invention, in which FIG. 1 is a plan view of a semiconductor integrated circuit device obtained in the embodiment of this invention, FIG. 2 is a sectional perspective view of its essential parts, FIG. 3 is a sectional view of the embodiment in FIG. 1, and FIG. 4 is a plan view of a conventional example;

FIG. 5 to FIG. 8 are drawings to explain a second embodiment of this invention, in which FIG. 5 is a plan view of wiring in the embodiment of this invention, FIG. 6 is a plan view of a wiring example in a method of, employing a master slice in the steps before forming transistor elements in the prior art, FIG. 7 is a plan view of wiring in a method of employing a master slice in the process up to the step of forming contact holes for connecting first layer wiring and second layer wiring, and FIG. 8 is a model drawing to show the mode of connection of each wiring when using a first layer wiring having a length enough to pass three second layer wirings;

FIG. 9 to FIG. 12 are drawings to explain a third embodiment of this invention, in which FIG. 9 is a plan view showing the wiring region and logic function cell regions of a master slice type integrated circuit device according to this invention, FIG. 10 is a model drawing of configuration of logic function cells A, B having connection requests to mutual terminals in logic function cell regions facing each other in a certain wiring region, FIG. 11 is a plan view in a state of realizing connection shown in FIG. 10, and FIG. 12 is a plan view of the embodiment applying this invention is logic function cell regions;

FIG. 13 to FIG. 18 are drawings to explain a fourth embodiment of this invention, in which FIG. 13 is a layout drawing of a master slice of which basic cell is composed of two-input gate isolation type, FIG. 14 is a plan view in a state of forming macrocell by wiring on the master slice shown in FIG. 13, FIG. 15 is a layout drawing of a master slide of which basic cell is composed of three-input oxide isolation type, FIG. 16 is a plan view in a state of forming macrocell by wiring on the master slice shown in FIG. 15, FIG. 16 is a layout drawing of a master slice of which basic cell is composed of two-input oxide isolation type, and FIG. 18 is a plan view in a state of forming macrocell by wiring on the master slice shown in FIG. 17; and FIG. 19 to FIG. 25 are drawings to explain a fifth embodiment of this invention, in which FIG. 19 is a plan view showing an entire surface element forming part of a master slice of a master slice type integrated circuit device according to the embodiment of this invention, FIG. 20 is a plan view showing a wiring example in the embodiments shown in FIG. 19, FIG. 21 is a plan view of composing an R-S latch circuit shown in FIG. 24 (a), (b) on the master slice in the embodiment in FIG. 19, FIG. 22 is a plan view showing an entire surface element forming part of a master slice in a method of employing the master slice in the process up to the step of forming transistor elements in the prior art, FIG. 23 is a plan view showing a wiring example in the prior art in FIG. 22, FIG. 24 (a), (b) are drawings to show the R-S latch circuit and its transistor composition, and FIG. 25 is a plan view showing the composition of the R-S latch circuit shown in FIG. 24 (a), (b) on the master slice in the prior art shown in FIG. 22 in the conventional method.

DETAILED DESCRIPTION OF THE PREFERRED EMBODIMENTS

Figure 1:
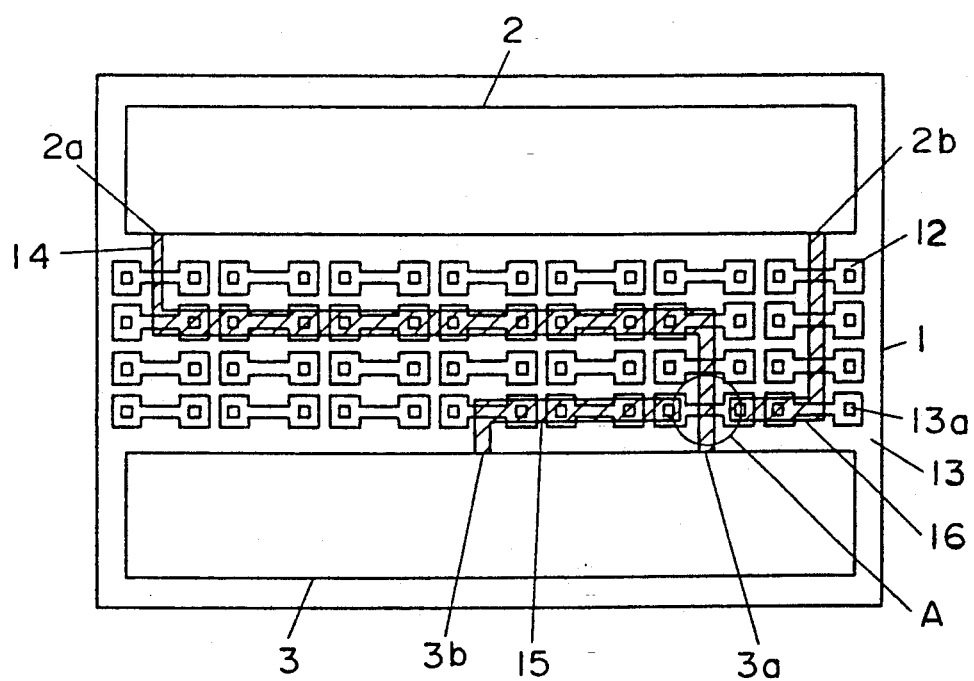
Figure 2:
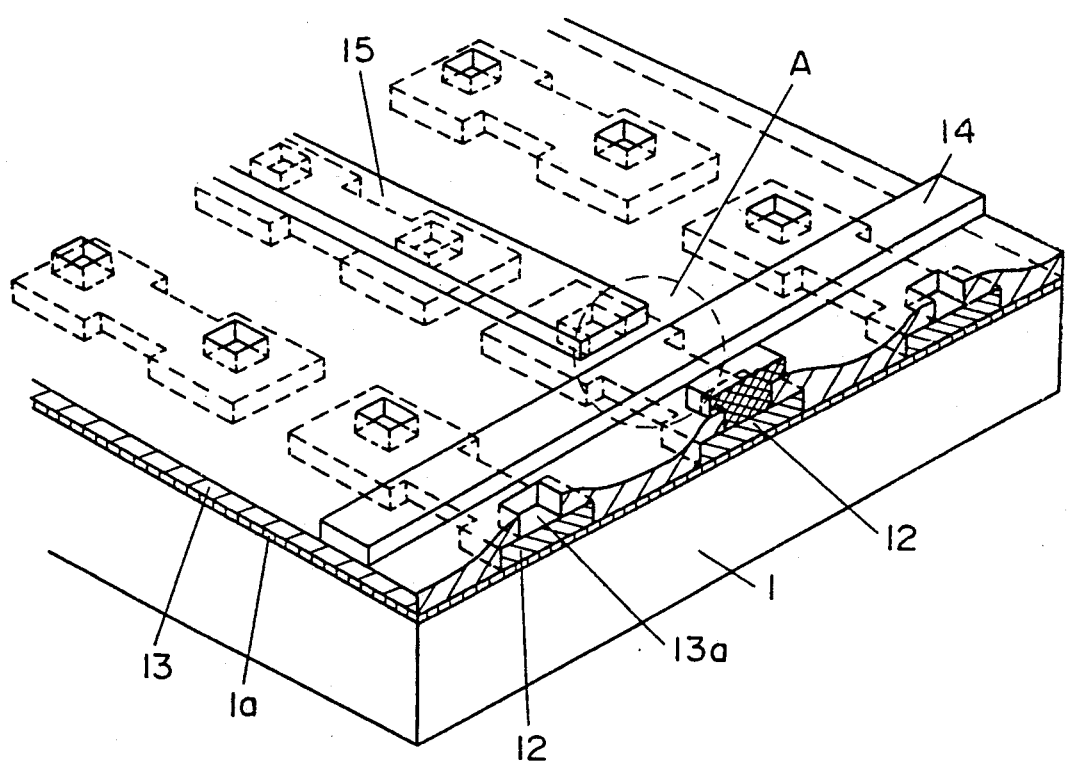
Figure 3:
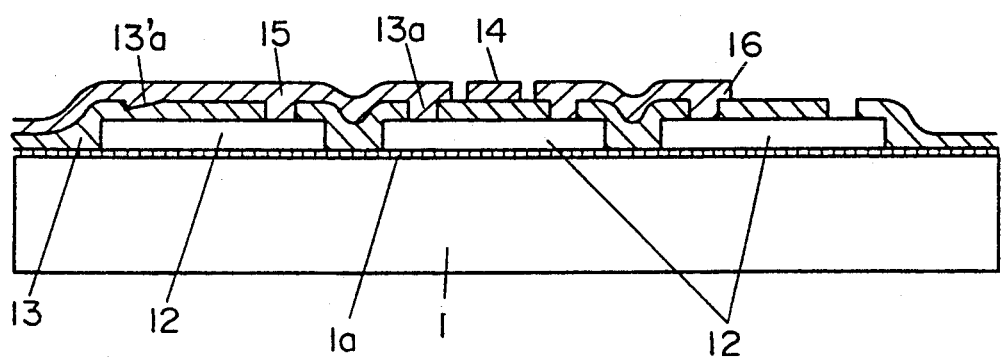
Figure 4:
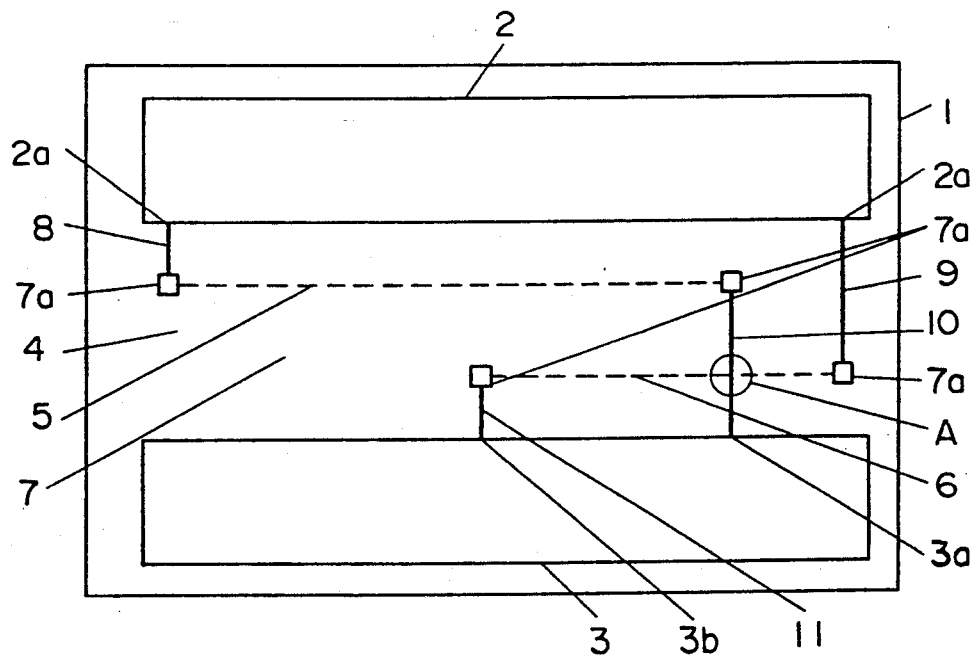

Referring now to FIGS. 1 to 3, a first embodiment of this invention is described below.

FIG. 1 is a plan view of a master slice integrated circuit device manufactured according to the first embodiment of this invention, in which plural logic function cells 2, 3 are formed on a semiconductor substrate 1. On the semiconductor substrate 1 between the logic function cells 2, 3, first layer wiring pieces 12 in a shape typified as shown in FIG. 1, FIG. 2 are formed longitudinally and laterally at specified intervals. An insulation layer 13 is formed on these plural first layer wiring pieces 12, and contact holes 13a are formed at specified positions of this insulation layer 13, that is, near the middle part of the wider portion at both ends of each first layer wiring piece 12. The process up to this point is finished as the first step, and this assembly is prepared as a master slice.

In a second step, second layer wirings 14, 15, 16 are formed in a necessary pattern on the insulation layer 13. At this time, part of the second layer wirings 14, 15, 16 is connected to the first layer wiring pieces 12 by way of contact holes 13a.

As a result, a terminal 2a of one logic function cell 2 and a terminal 3a of the other logic function cell 3 are connected by means of first layer wiring pieces 12 and second layer wiring 14, whereas a terminal 2b and a terminal 3b are connected by means of first layer wiring pieces 12 and second layer wirings 15, 16. In the crossing portion A, moreover, as shown in FIG. 2, the first layer wiring pieces 12 and second layer wiring 14 are insulated from each other by way of the insulation layer 13, so that no trouble occurs.

Thus, according to this invention, since the first step up to formation of first layer wiring pieces 12 and contact holes 13a can be effected regardless of the features of the logic circuits, they can be mass-produced preliminarily, and the final circuit can be realized by forming the second layer wirings 14 to 16 depending on the individual circuits, so that the term of development and manufacture of semiconductor integrated circuits may be notably shortened.

In FIG. 1, the terminals 2a, 3a can be connected by the second layer wiring 14 only, but when constructed as in this embodiment, that is, by forming the second layer wiring 14 continuously on the plural first layer wiring pieces 12 arranged in a row, and connecting this second layer wiring 14 partly to the first layer wiring pieces 12 in the lower layer by way of the contact holes 13a, if part of the second layer wiring 14 is broken due to step breakage or other cause, this broken portion can be compensated for by the first layer wiring pieces 12, so that the manufacturing yield can be enhanced. The same effect may be also enjoyed if the contact holes 13a are not formed correctly; for example, if the hole itself is clogged as in the contact hole 13a' shown at the left end of FIG. 3, making it impossible to contact, a secure connection is achieved by the continuously formed second layer wiring 15, so that the manufacturing yield can be enhanced.

In the above embodiment, the assembly up to completion of first layer wiring pieces 12 and formation of contact holes 13a in the insulation layer 13 above them is used as a master slice, but instead an assembly up to completion of steps of piling up layers sequentially, each layers is composed of wiring pieces and insulation layer thereon, in as many layers as required furthermore on the insulation layer 13, connecting the wiring pieces through contact holes in the insulation layer, and forming contact holes in the insulation layer of the uppermost layer may be used as a master slice, and a final circuit may be constructed by applying a final layer of wiring on the uppermost layer of the insulation layer according to the individual circuits.

In FIGS. 1 to 3, an example of wiring in the wiring region between logic function cells is explained, but this invention can be applied also to wiring within logic function cell region. In short, this invention can be applied to all cases of connecting plural diffusion regions formed on the semiconductor substrate 1.

Needless to say, as shown in FIGS. 2, 3, an insulation layer 1a such as SiO$_2$ is formed on the semiconductor substrate 1, and the first layer wiring pieces 12 are isolated from the semiconductor substrate 1 by the insulation layer 1a in the wiring area. However, in the logic function cell region, plural through holes (not shown) are formed in the insulation layer 1a, and the first layer wiring pieces are connected to appropriate diffusion regions formed in the semiconductor substrate 1 by way of the through holes. This construction is common in all embodiments of this invention explained hereinafter.

Thus this embodiment is to realize the final circuit by fabricating a master slice by finishing up to the step of forming wiring pieces of lower layer on a n impurity diffused semiconductor substrate and contact holes thereon, and then connecting only one top layer of wiring according to the individual circuits. Therefore, since the process up to the contact hole forming step can be executed regardless of the features of individual circuits, a preliminary mass production is possible, and final products can be completed only by wiring the top layer depending on the requirements of individual users. It is hence possible to cope with a variety of products, and the term for development and manufacturing may be significantly shortened.

Next, a second embodiment of this invention capable of minimizing the increase of wiring region is described, below while referring to FIGS. 5 through 8.

Figure 6:
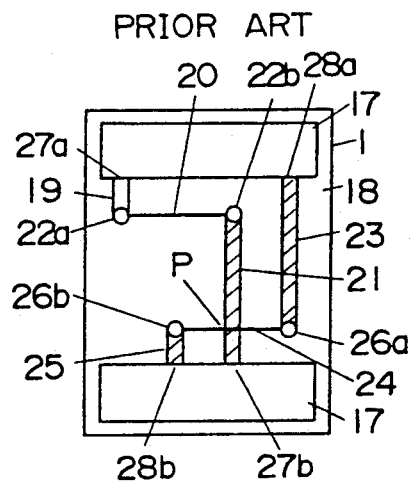

FIG. 6 shows a wiring state between logic function cells by automatic wiring of master slice type integrated circuit in the prior art, in which logic function cells 17, 17 formed on a semiconductor substrate 1 are coupled together by way of wiring 19, 21, 23, 25 and contact holes 22a, 22b, 26a, 26b disposed on a wiring region 18. The logic function cells 17, 17 are individually composed of a mass of multiple transistor elements (not shown) formed on the semiconductor substrate 1. Terminals 27a and 27b of logic function cells 17, 17 are coupled together by means of first layer wiring 20 and second layer wirings 19, 21 and contact holes 22a, 22b connecting them, while terminals 28a, 28b are coupled together by means of first layer wiring 24 and second layer wirings 23, 25 and contact holes 26a, 26b connecting them. As indicated by P in FIG. 6, when wiring between the logic function cells 17, 17, an intersection occurs in the wiring, but at point P, since the first layer wiring 24 and second layer wiring 21 are insulated by the intervening insulation layer (not shown), the individual wirings 24, 21 remain independent electrically.

Figure 7:
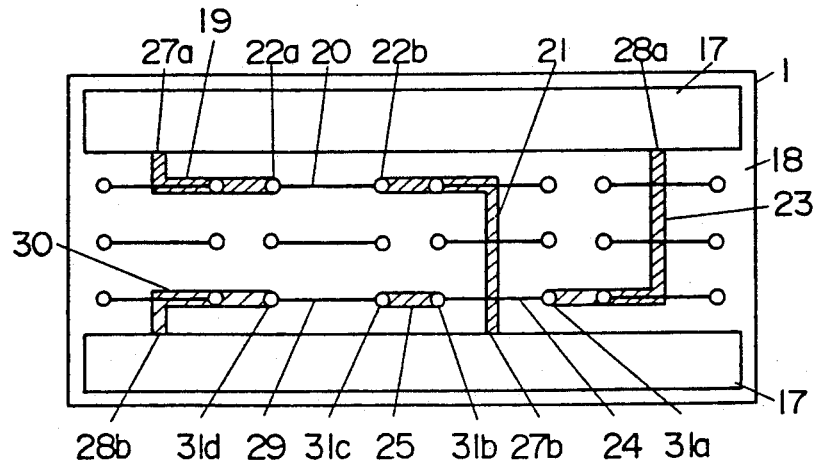
Figure 8A:
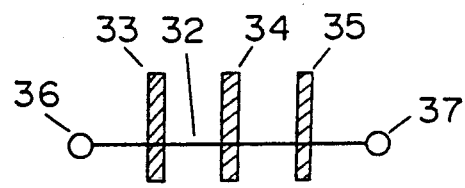
Figure 8B:
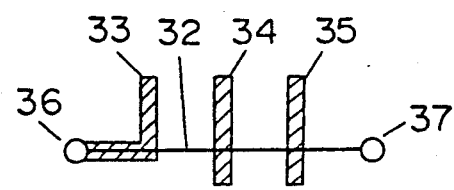
Figure 8C:
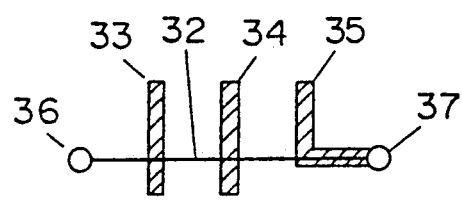
Figure 8D:
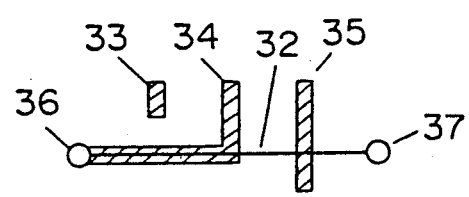
Figure 8E:
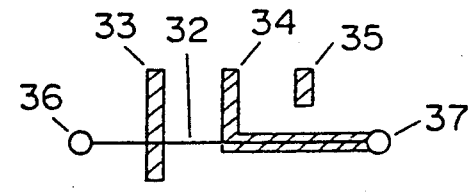

On the other hand, FIG. 7 shows a wiring state by the master slice method in which desired circuits are achieved only by second layer wirings by comprising the master slice step up to the step for forming the through holes for connecting the transistor elements and first layer wiring pieces and contact holes for connecting the first layer wiring pieces and second layer wirings, in addition to the step of forming transistor elements. The logic function cells 17, 17 formed on the semiconductor substrate 1 are coupled together by means of the wirings 19, 20, 21, 23, 24, 25, 29, 30 and contact holes, 22a, 22b, 31a, 31b, 31c, 31d formed on the wiring region 18. Terminals 27a, 27b of logic function cells 17, 17 are coupled together by means of the first layer wiring piece 20 and second layer wirings 19, 21 and contact holes 22a, 22b for connecting them. Terminals 28a, 28b are coupled together by means of the first layer wiring pieces 24, 29, second layer wirings 23, 25, 30, and contact holes 31a to 31d for connecting them.

In FIGS. 6, 7, meanwhile, the configuration of the terminals 27a, 28a, 27b, 28b of logic function cells 17, 17 is equivalent. That is, FIG. 6 and FIG. 7 are different in the circuit form, but are equivalent as circuit function.

Incidentally, when the master slice process is compared between the method of forming up to contact holes for connecting the first layer wiring pieces and second layer wirings as shown in FIG. 7, and the method of forming up to transistor elements as shown in FIG. 6, it is known that the area of required wiring region 18 in FIG. 7 for realizing equivalent connection relations becomes larger than that shown in FIG. 6, resulting in increase of the area of the entire chip.

This is, as shown in FIG. 6, when the required connection relation is realized by both first layer wirings and second layer wirings after the master slice step, the first layer wirings and second layer wirings may be manufactured only as much as required, and it is not necessary to form unnecessary wirings. However, as shown in FIG. 7, when it is attempted to realize the required connection relation by the second layer wiring along after the master slice step, in order to keep the same degree of freedom of wiring as in FIG. 6, it is necessary to form a certain number of first layer wiring pieces as shown in FIG. 7 preliminarily to have a sufficient allowance in the master slice step. Still more, in the example shown in FIG. 7, since the length of the first layer wiring pieces is set at an exact length for allowing to pass one wire of second layer wiring, and the length of the first layer wiring piece itself is nearly same as that of the first layer wiring in FIG. 6. Therefore, since it is necessary to form multiple first layer wiring pieces at proper intervals, the area of the wiring region 18 becomes very wide.

The second embodiment of this invention is intended to solve this problem. It is hence another object of this invention to present a master slice type integrated circuit device capable of suppressing the increase of the area of wiring region when the so-called custom mask after the master slice step is realized by the second layer wiring alone.

To achieve this object, the master slice type integrated circuit device in the second embodiment of this invention is constituted by setting the length of first layer wiring piece possessing contact holes for connection with the second layer wiring at both ends at an exact length enough to pass only two wires of the second layer wiring keeping independent electrically from the first layer wiring piece by means of an insulation layer thereon, using it as first layer wiring piece of specified shape, and arranging such first layer wiring pieces regularly on the master slice.

In this constitution, the desired circuit may be realized by the second layer wiring alone, and the increase of chip area due to increase of area of wiring region may be minimized in the master slice method.

The second embodiment of this invention is further explained below by referring to the accompanying drawings.

Figure 5:
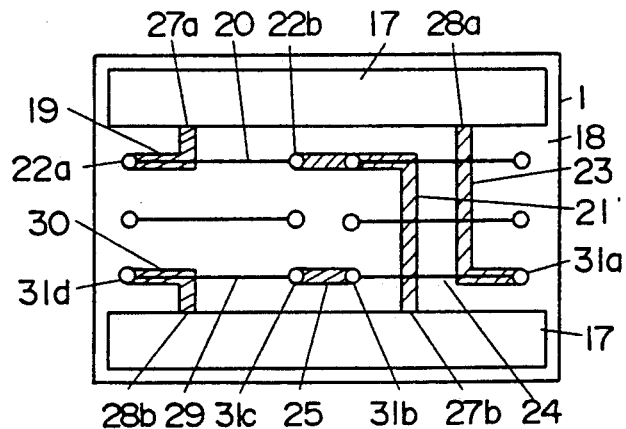

FIG. 5 shows a wiring state of the master slice type integrated circuit device in the second embodiment of this invention. Plural logic function cells 17, 17 are formed on the semiconductor substrate 1. Between the logic function cells 17, 17, there are first layer wiring pieces 20, 24, 29 etc. possessing an exact length enough for passing only two wires of the second layer wiring thereabove and possessing contact holes for connecting the first layer wiring pieces and second layer wiring at both ends are regularly arranged in the wiring region 18 at specified intervals in the longitudinal and lateral directions. On these first layer wiring pieces, an insulation film (not shown) is formed, and second layer wirings 19, 21, 23, 25, 30 are formed further thereon.

In the master slice type integrated circuit device of this embodiment formed in this way, terminals 27a, 27b of the logic function cells 17, 17 are coupled together by means of the first layer wiring piece 20, second layer wirings 19, 21, and contact holes 22a, 22b for connecting them, whereas terminals 28a, 28b are coupled together by means of the first layer wiring pieces 24, 29, second layer wirings 23, 25, 30, and contact holes 31a to 31d for connecting them.

According to this embodiment, an equivalent connection relation to the wiring by the first layer wirings, second layer wirings and contact holes for connecting them as shown in FIG. 6 may be realized by the second layer wirings only after the master slice step. Therefore, the term of development may be greatly shortened.

Next, the area required for wiring is explained. In the conventional method of employing the master slice in the process up to the step of forming transistor elements shown in FIG. 6, to realize the wiring in FIG. 6, an area for passing four wires of the second layer wirings, that is, 19, 21, 23, 25, in the longitudinal direction was required. By contrast in the method of FIG. 7 of wiring only by the second layer wirings, an area for passing 12 wires of the second layer wiring is needed in order to realize the same wiring as in FIG. 6. In other words, an area for a total 12 wires comprising the middle part of the first layer wiring pieces (4 wires) and the upper part of the contact hole row (8 wires) is needed. However, in the case of the second embodiment of this invention shown in FIG. 5, since the length of the first layer wiring piece is set at a length enough for passing only two wires of the second layer wiring thereabove, it is possible to realize the same wiring as in FIG. 6 in an area for passing eight wires of the second layer wiring only. That is, according to the second embodiment of this invention, as compared with the method in FIG. 7, the area required for wiring may be reduced to $\frac{2}{3}$. As a result, the chip area can be reduced, and the yield is improved, and inexpensive chips can be developed.

Moreover, according to this embodiment, since the length of the first layer wiring pieces is set at a length enough for passing only two wires of the second layer wiring thereabove, the basic part of the algorithm of the conventional automatic wiring program employed in the automatic designing of wiring by computer shown in FIGS. 6, 7 can be directly used.

To the contrary, if the length of the first layer wiring pieces is set at a length enough to pass three or more wires of the second layer wiring thereabove, and three or more wires of the second layer wiring are designed to pass above each first layer wiring piece, the algorithm of the conventional automatic wiring program cannot be applied. This reason is explained by reference to FIG. 8.

In FIG. 8, the first layer wiring pieces have a length capable of passing three wires of the second layer wiring thereabove. In FIG. 8 (a) to (e), 32 is a first layer wiring piece having the length mentioned above, and 33 to 35 denote three wires of the second layer wiring to pass above the first layer wiring piece 32. At both ends of the first layer wiring pieces 32, contact holes 36, 37 for connecting the first layer wiring piece 32 and second layer wirings 33 to 35 are formed in the insulation layer (not shown).

Suppose here to connect any one of the second layer wirings 33, 34, 35 to the first layer wiring 32. When the second layer wiring 33 at the left side is connected to the first layer wiring 32, as shown in FIG. 8 (b), part of the second layer wiring 33 is folded to the left side, and by using the left side contact hole 36, the second layer wiring 33 can be connected to the first layer wiring piece 32 without impeding the passing of the remaining two second layer wirings 34, 35. Or when the right side second layer wiring 35 is connected to the first layer wiring 32, as shown in FIG. 8 (c), part of the second layer wiring 35 is folded to the right side, and by making use of the right side contact hole 37, the second layer wiring 35 can be connected to the first layer wiring piece 32 without impeding the passing of the remaining two second layer wirings 33, 34. However, as shown in FIG. 8 (d), when the second layer wiring 34 in the middle portion is connected to the first layer wiring piece 32, if the middle second layer wiring 34 is folded toward the left side contact hole 36, passing of the left side second layer wiring 33 is impeded, or if folded toward the right side contact hole 37, passing of the right side second layer wiring 35 is impeded. Therefore, the algorithm of the conventional automatic wiring program based on the condition that the second layer wiring and first layer wiring be connected without impeding the passing of other second layer wirings cannot be applied in the example shown in FIG. 8.

Different form this, in the embodiment shown in FIG. 5 in which the length of each first layer wiring piece is set at an enough length for passing only two wires of the second layer wiring thereabove, by folding one wire of the second layer wiring in the direction of going away from the other wires of the second layer wiring, the second layer wiring and the first layer wiring piece can be connected without impeding the passing of the other second layer wiring. Accordingly, the basic part of the algorithm of the conventional automatic wiring program can be directly applied.

Thus, in the second embodiment of this invention, by setting the length of the first layer wiring piece at a length enough for passing only two wires of the second layer wiring keeping electrically independent from the first layer wiring piece by an insulation layer thereon, and arranging such first layer wiring pieces regularly on the master slice, the time required for the final process depending on the different circuits after the common master slice step can be shortened, and the increase of chip area required for wiring can be suppressed. Still more, the basic part of the algorithm of the conventional automatic wiring program based on the condition that the second layer wirings and first layer wiring piece be connected without impeding passing of other second layer wirings may be directly applied.

Referring then to FIGS. 9 to 12, a third embodiment of this invention is described, in which plural first layer wiring pieces are regularly arranged so that the contact holes on the first layer wiring pieces for connecting the first layer wiring pieces and second layer wirings are arrayed on a straight line along the main wiring direction of the second layer wiring, whether in the logic function cell regions or in the wiring regions.

When the contact hole row is arranged on a straight line, whether in the logic function cell regions or in the wiring regions, the wiring interval rule of the second layer wirings may be identical in the logic function cell regions and in the wiring regions. Accordingly, the second layer wirings formed in the wiring regions can be straightly extended into the logic function cell regions without once folding on the way, and a special regions for adjustment of the wiring interval rule, that is, for folding the second layer wirings may be omitted, so that the chip area may be reduced.

Figure 9:
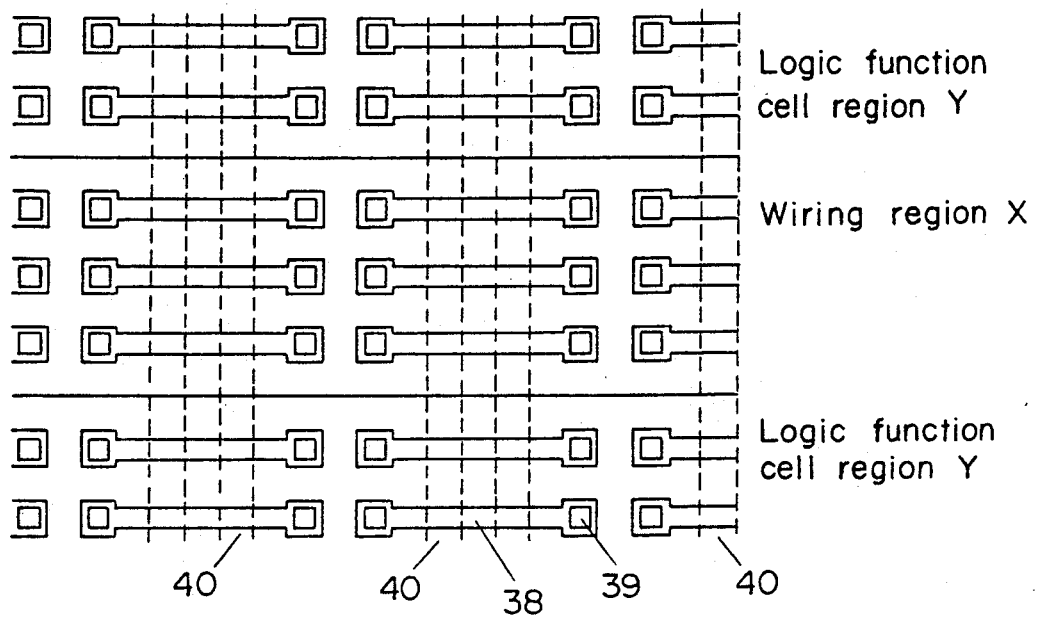

FIG. 9 shown a wiring region X, first layer wiring pieces 38 in logic function cell regions Y, Y, and contact holes 39 for connecting the first layer wiring pieces and second layer wirings, in the master slice type integrated circuit device according to the third embodiment of this invention. In this embodiment, each first layer wiring piece 38 has an exact length enough for passing only two wires of the second layer wiring, and the contact holes 39 for connecting the first layer wiring pieces and second layer wirings are positioned at the both ends of each first layer wiring piece. The first layer wiring pieces 38 are regularly arranged alike in the wiring region X and logic function cell regions Y, Y, without distinguishing these regions, so that the right and left contact hole rows may be arrayed on a straight line, and this assembly is prepared as a master slice. Numeral 40 indicates the passing region of the second layer wiring.

In thus composed master slice type integrated circuit device of this embodiment, wiring between two logic function cells is described below.

Figure 10:
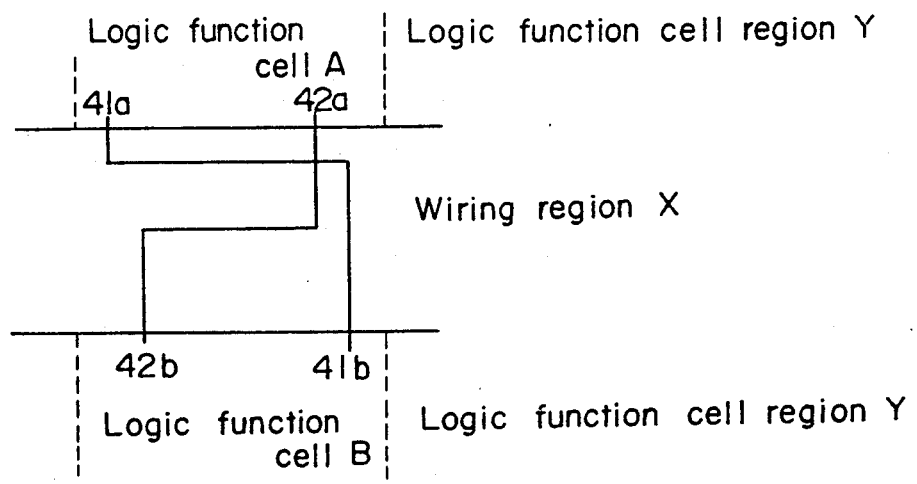

In FIG. 10, two logic function cells A, B are disposed across an intervening wiring region, and it shows necessary to connect a terminal 41a of the logic function cell A with a terminal 41b of the logic function cell B, and a terminal 42a of the logic function cell A and a terminal 42b of the logic function cell B.

Figure 11:
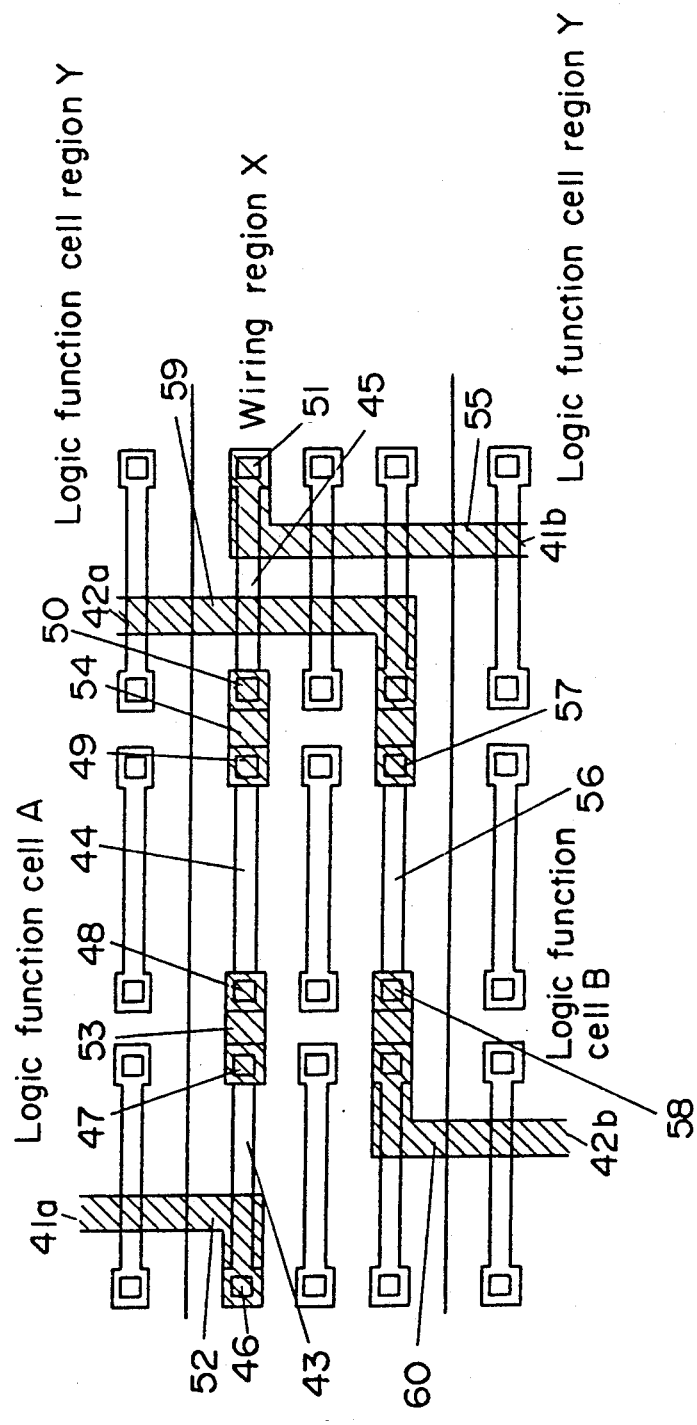

FIG. 11 shows a result of wiring effected in this embodiment to realize such requirements. Specifically, the connection between terminals 41a, 41b is achieved by first layer wiring pieces 43, 44, 45, contact holes 46, 47, 48, 49, 50, 51, and second layer wirings 52, 53, 54, 55, whereas the connection between terminals 42a, 42b is achieved by first layer wiring piece 56, contact holes 57, 58, and second layer wirings 59, 60.

The individual logic function cells A, B must have inherent functions as inverter, NOR gate, and others. Accordingly, as for the second layer wiring extended in the logic function cell A or B region, the wiring pattern must be changed depending on whether the logic function cell is to be used as inverter or NOR gate. In the embodiment in FIG. 11, however, the rules about the shape and intervals of the first layer wiring pieces and contact holes in the logic function cell regions Y, Y are identical not only in the logic function cells A, B, but also in the wiring region X, the wiring interval of the second layer wiring is not distinguished between the logic function cell regions Y, Y and wiring region X, and is hence identical. Therefore, as shown in FIG. 11, the second layer wiring extended from the wiring region X into the logic function cell regions Y, Y can be wired straightly without having to fold on the way. In other words, the required wiring may be realized without having to dispose any particular adjusting region (the region for folding) at the boundary part between the logic function cell regions Y, Y and wiring region X. Besides, since the second layer wiring is not folded, breakage of wiring due to folding may be avoided.

Figure 12:
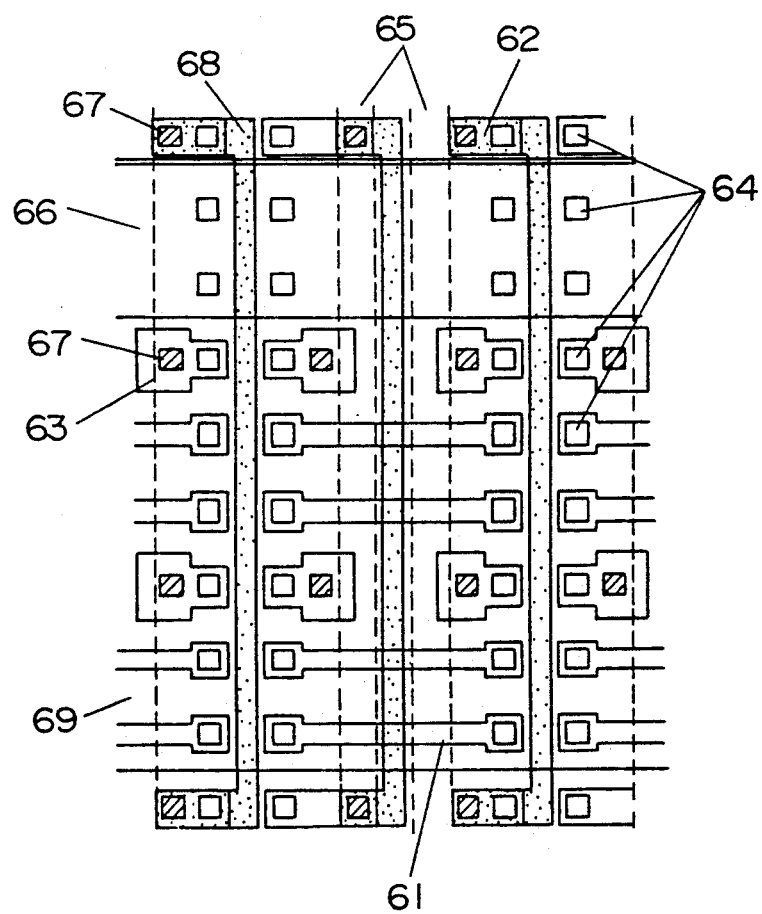

An example of applying the third embodiment of this invention is the logic function cell region is shown in FIG. 12. This drawing shows the logic function cell region of the master slice type integrated circuit device according to the third embodiment of this invention. In FIG. 12, 61, 62, 63 are first layer wiring pieces, 64 is a contact hole for connecting the first layer wiring pieces and second layer wirings, 65 is a region for passing the second layer wiring, 66 is a first layer wiring to become the power source wiring, 67 is a through hole for connecting a transistor element and the first layer wiring pieces, 68 is a gate electrode of the transistor element, and 69 is a source or drain region of the transistor element. In this embodiment, similar to the preceding embodiments, the first layer wiring piece 61 has an enough length for passing only two wires of the second layer wiring.

As clear from FIG. 12, in this embodiment, because of logic function cell region instead of the wiring region, mutually different shapes are used as the first layer wiring pieces 61, 62, 63, but in this case, too, the contact holes 64 for connecting the first layer wiring pieces and second layer wiring are all arranged on a straight line along the main wiring direction of the second layer wiring. That is, the wiring interval rules are identical at all locations in the logic function cell region. Therefore, when the region 65 for passing the second layer wiring is set at a position not disturbed by the arrangement of the contact holes 64 as shown in FIG. 12, it is not necessary to fold the second layer wiring on the way in the main wiring direction. Accordingly it is not necessary to dispose any particular adjusting region (the region for folding) in the logic function cell region, and the chip area may be reduced accordingly. Besides, since it is not necessary to fold the second layer wiring, breakage of wiring by folding may be avoided.

Meanwhile, as stated earlier, each logic function cell formed in the logic function cell region must have a function as inverter or NOR gate depending on the purpose. For this purpose, actually, part of the second layer wiring passing through the region 65 shown in FIG. 12 is projected either in the left direction or right direction, and this projected portion must be brought into contact with the source or drain region 69 of the transistor by way of a specified contact hole 64. In this case, too, since the main wiring direction of the second layer wiring itself stretches in a straight line and it is not necessary to fold, and therefore the chip area can be reduced and the trouble by missing of wiring may be solved same as mentioned above.

As clear from the explanation in relation to FIG. 12, this embodiment may be applied also in the master slice type integrated circuit device of so-called full-surface buried type in which only plural logic function cells are formed solidly in the entire chip area, without having wiring region on the chip. That is, in this case, too, the contact hole row of the first layer wiring pieces is arranged in a straight line across all logic function cell regions. It is therefore not necessary to dispose any particular wiring interval adjusting region (the region for folding the second layer wiring) in the boundary part of the adjacent logic function cells, and hence the chip area can be reduced and the problem of missing of wiring can be solved.

Thus, according to the third embodiment of this invention, by forming arranging regularly plural first layer wiring pieces positioning the contact holes for connecting the first layer wiring pieces and second layer wirings at their end parts, so that the contact holes on the first layer wiring pieces may be arrayed on a straight line along the main wiring direction of the second layer wiring, the wiring interval rules of the second layer wiring may be set identical whether in the logic function cell region or in the wiring region. Accordingly, the extra region for adjustment of wiring interval rules is unnecessary, and the chip area may be reduced. Furthermore, by forming all contact holes for connecting the first layer wiring pieces and second layer wirings only on a straight line in which the contact hole row at both ends of the first layer wiring pieces are present, within the logic function cell region, the same effects are obtained in the master slice type integrated circuit device of full surface buried type having no wiring region. As a result, the term for development of master slice type integrated circuit device is notably shortened, and the increase of chip area may be kept to a minimum.

Incidentally, hitherto, in the master slice method, automatic layout design by using computer processing has been employed in order to shorten the term for development. At this time, so as to achieve automatic wiring easily and in a short time, it is a general practice to employ the grid wiring technique for wiring only connectable routes (called tracks) that are set at fixed intervals.

FIGS. 13 to 18 show a fourth embodiment of this invention capable of directly utilizing the basic part of such grid wiring technique.

Figure 13:
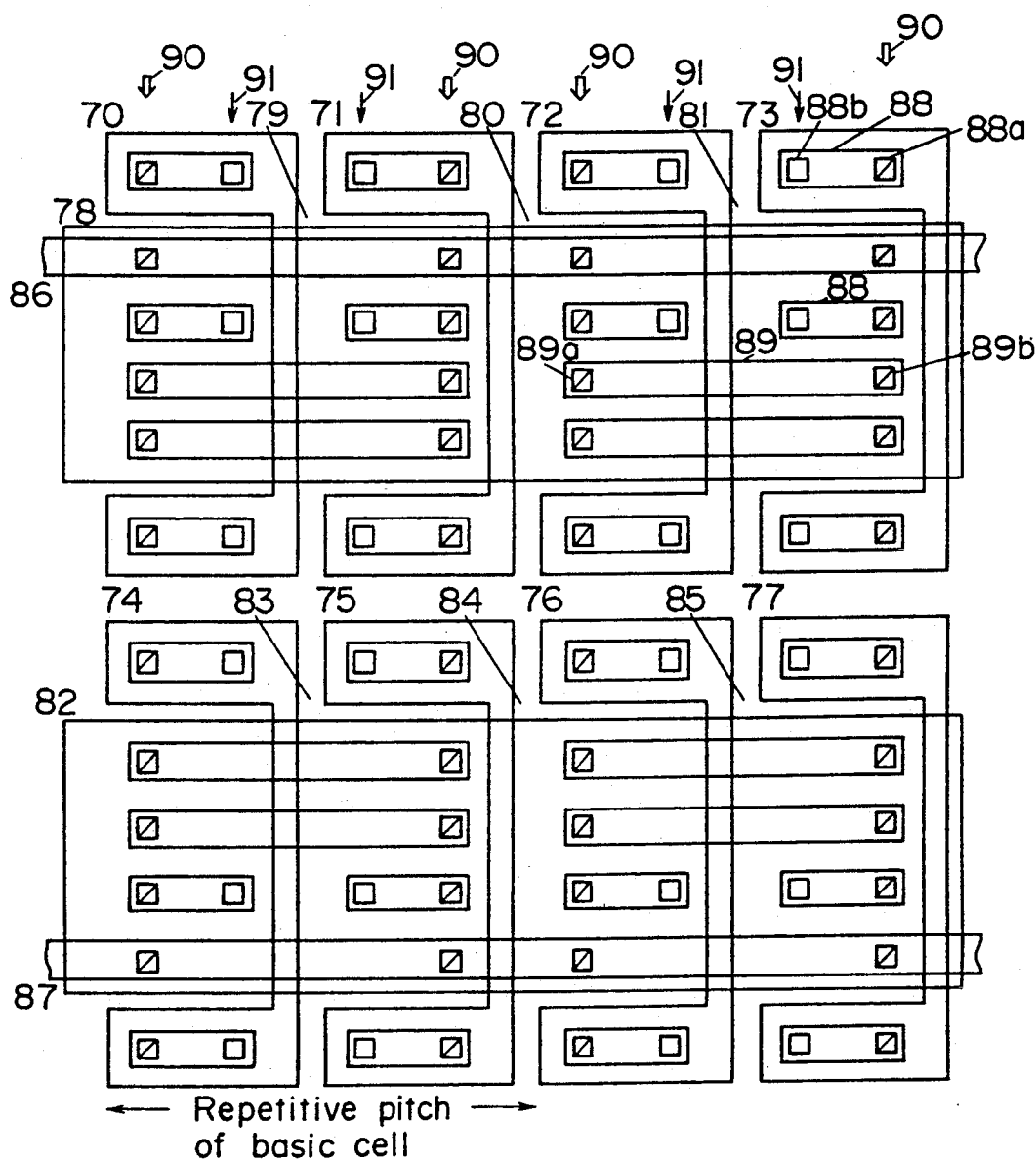

FIG. 13 shows a pattern of a master (before final wiring formation) of basic element group (called basic cell) of master slice type CMOS integrated circuit device in the fourth embodiment of this invention, in which the pattern for the portion of two units of the basic cell is shown. Numerals 70 to 73 are gate electrodes of P-channel transistor (called P-chTr), 74 to 77 are gate electrodes of N-channel transistor (called N-chTr), 78 to 81 are P+ diffusion regions for forming source or drain, 82 to 85 are N+ diffusion regions for forming source or drain, 86 is a VDD power source wire, and 87 is a VSS power source wire. Numeral 88 denotes a first one of first layer wiring pieces having a through hole 88b at one end and a contact hole 88a at the other end, formed on at least one of all gates sources and drains. And 89 is a second one of first layer wiring pieces having contact holes 89a, 89b at both ends, and possessing a length enough to dispose these contact holes 89a, 89b at both right and left ends of the repetitive pitch of the basic cell. The contact hole 88a on the first layer wiring piece 88 is formed on the same track 90 as the contact hole 89a or 89b on the first layer wiring piece 89, while the through hole 88b is formed on the track 91 not forming contact hole on the first layer wiring piece 89.

Actually, however, the through hole 88b is formed in the insulation layer between the semiconductor substrate surface and the first layer wiring pieces 88, and the contact holes 88a, 89a, 89b are formed in the insulation layer on the first layer wiring pieces 88, 89. But for the sake of simplicity of explanation, here, such relation is expressed such as "to have through hole 88b at one end of first layer wiring piece 88" or "to have contact holes 89a, 89b at both ends of first layer wiring piece 89."

Figure 14:
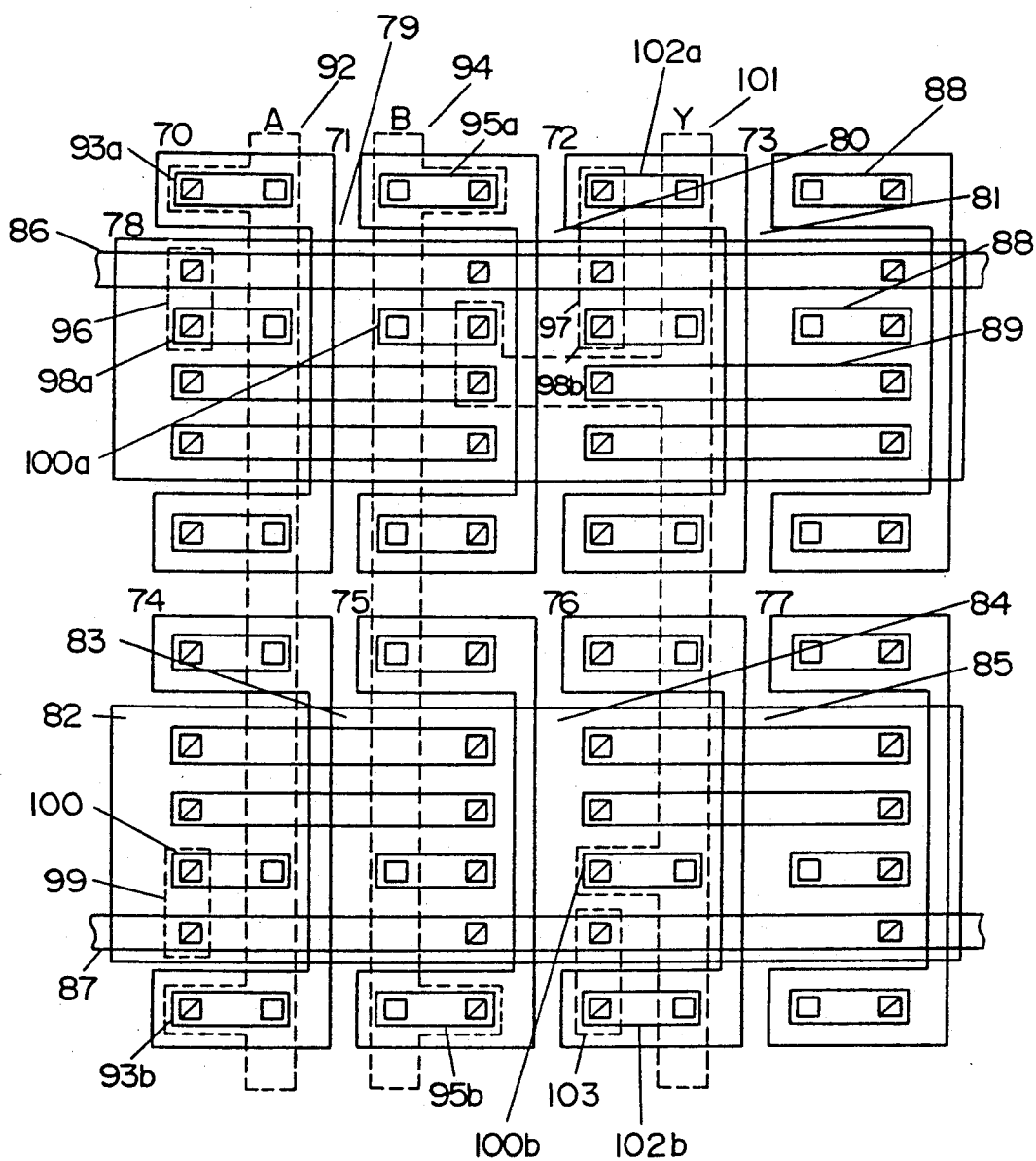

FIG. 14 is an embodiment of macrocell by the foregoing master slice in the fourth embodiment of this invention, in which a two-input NAND gate is shown. Numerals 70 to 89 are same as those shown in FIG. 13. An input signal A is connected to the gate electrode 70 of P-chTr and the gate electrode 74 of N-chTr by way of first layer wiring pieces 93a, 93b from second layer wiring 92 respectively. An input signal B is similarly connected to the gate electrode 71 of P-chTr and the gate electrode 75 of N-chTr by way of first layer wiring pieces 95a, 95b from second layer wiring 94 respectively. By the second layer wirings 96, 97, and first layer wiring pieces 98a, 98b, P+ diffusion regions 78, 80 are connected to a VDD power source wire 86 to become the source of P-chTr. By the second layer wiring 99 and first layer wiring piece 100, N+ diffusion region 82 is connected to the VSS power source wire 87 to becomes the source of N-chTr. The P+ diffusion region 79 is connected to the second layer wiring 101 by way of the first layer wiring piece 100a, and the N+ diffusion region 84 is connected to the same second layer wiring 101 by way of the first layer wiring piece 100b. As a result, the drain of P-chTr and the drain of N-chTr are mutually connected, and the second layer wiring 101 becomes the output terminal of output signal Y. By the first layer wiring pieces 102a, 102b and the second layer wirings 97, 103, the gate electrodes 72, 76 are respectively connected to the VDD power source wire 86 and VCC power source wire 87. As a result, the channel regions of P-chTr and N-chTr are turned off, the conduction with the right side diffusion regions is cut off individually.

In this way, the two-input NAND gate is composed.

In this embodiment, the basic cell was of two-input gate isolation structure, but this invention may be also embodied in other structures than the basic cell structure.

Figure 15:
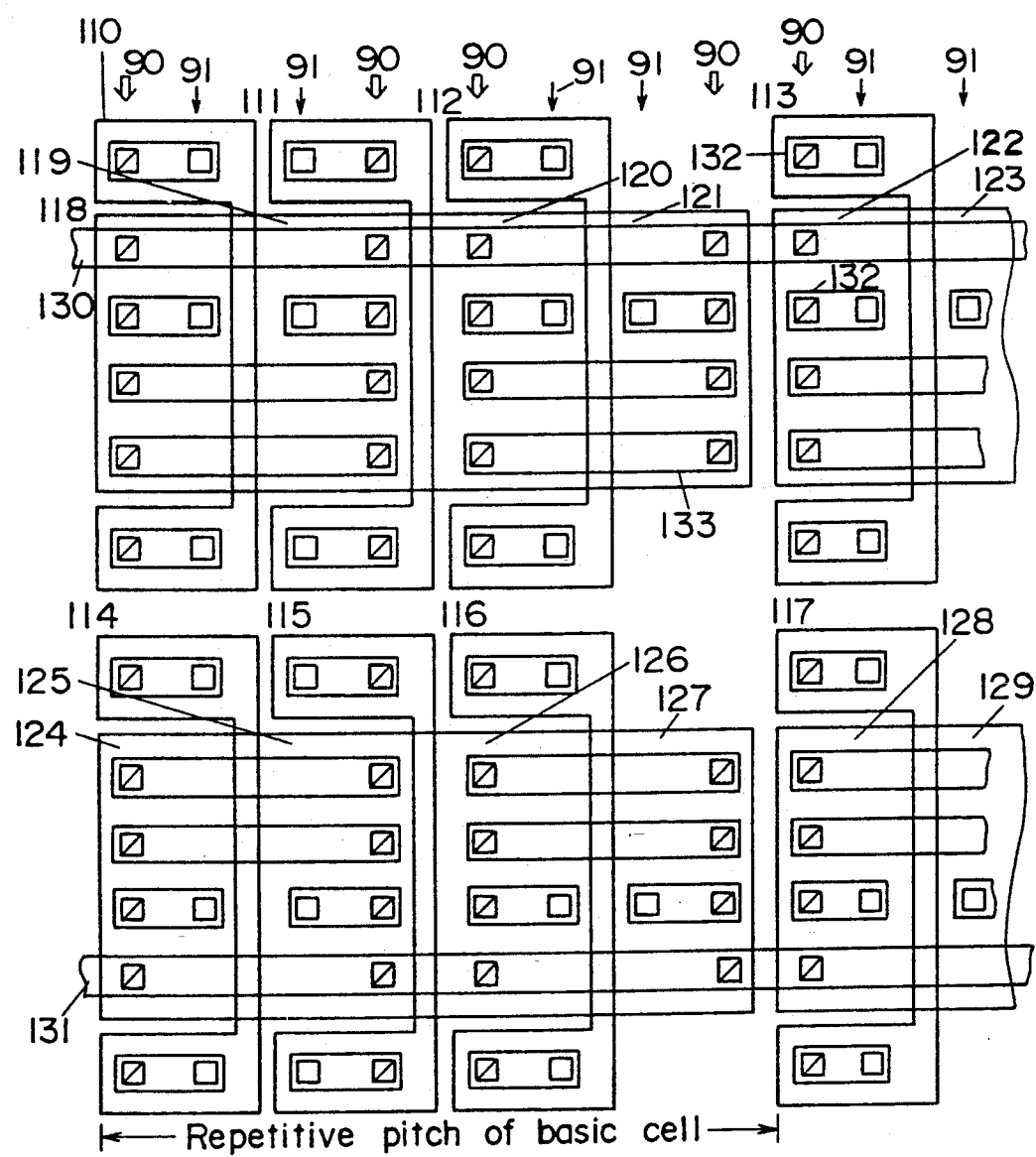

For example, an embodiment of this invention by basic cell in oxide isolation structure is shown below. FIG. 15 is a master layout of which basic cells is in three-input oxide isolation structure, wherein 110 to 113 are gate electrodes of P-chTr, 114 to 117 are gate electrodes of N-chTr, 118 to 123 are P+ diffusion regions, 124 to 129 are N+ diffusion regions, 130 is a VDD power source wire, and 131 is a VSS power source wire. Numeral 132 is a first one of the first layer wiring pieces in the same shape as the one indicated by numeral 88 in FIG. 13. Numeral 133 is a second one of the first layer wiring pieces in the same shape as the one indicated by numeral 89 in FIG. 13. The second first layer wiring piece 133 has contact holes at its both ends, and it has a length enough to pass only two wires of the second layer wiring insulated by insulation layer (not shown) on the first layer wiring piece 133, and two pieces are formed in one basic cell in the lengthwise direction of the first layer wiring piece 133.

Figure 16:
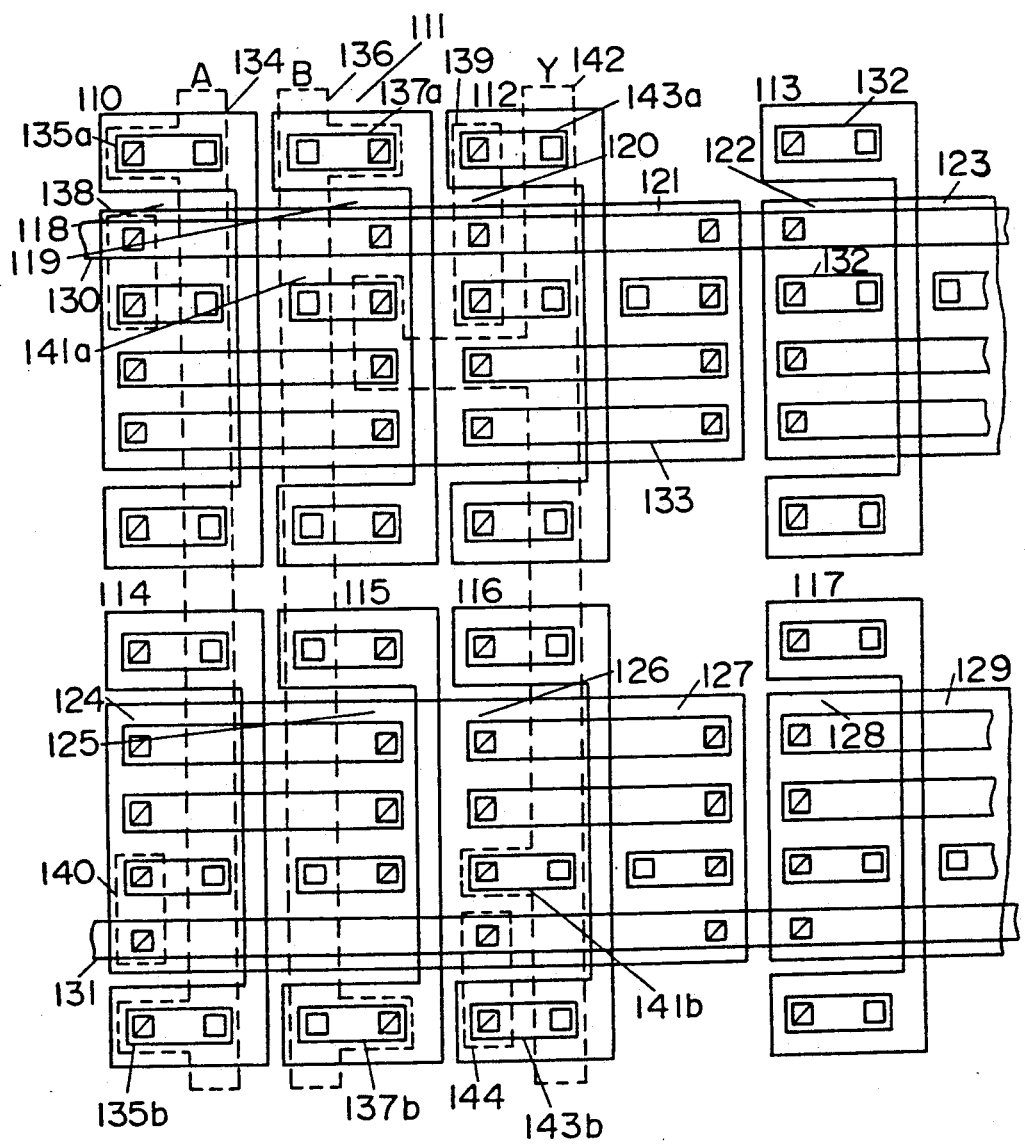

FIG. 16 shows an embodiment of a macrocell by the master slice shown in FIG. 15, in which a two-input NAND gate is composed. An input signal A is connected to the gate electrode 110 of P-chTr and the gate electrode 114 of N-chTr through first layer wiring pieces 135a, 135b from the second layer wiring 134, while an input signal B is similarly connected to the gate electrode 111 of P-chTr and the gate electrode 115 of N-chTr through first layer wiring pieces 137a, 137b from the second layer wiring 136. By the second layer wirings 138, 139, P+ diffusion regions 118, 120 are connected to a VDD power source wire 130 to become the source of P-chTr. By the second layer wiring 140, N+ diffusion region 124 is connected to a VSS power source wire 131 to become the source of N-chTr. The P+ diffusion region 119 is connected to the second layer wiring 142 through the first layer wiring piece 141a, and the N+ diffusion region 126 is connected to the same second layer wiring 142 through the first layer wiring piece 141b. As a result, th drain of P-chTr and the drain of N-chTr are mutually connected, and the second layer wiring 142 becomes the output terminal of output signal Y. In addition, by the first layer wirings 143a, 143b and the second layer wirings 139, 144, the gate electrodes 112, 116 are respectively connected to the VDD power source wire 130 and VSS power source wire 131. In this constitution, the channel regions of P-chTr and N-chTr are turned off, and the diffusion regions 120, 126 are separated from the right-side diffusion regions, respectively.

Figure 17:
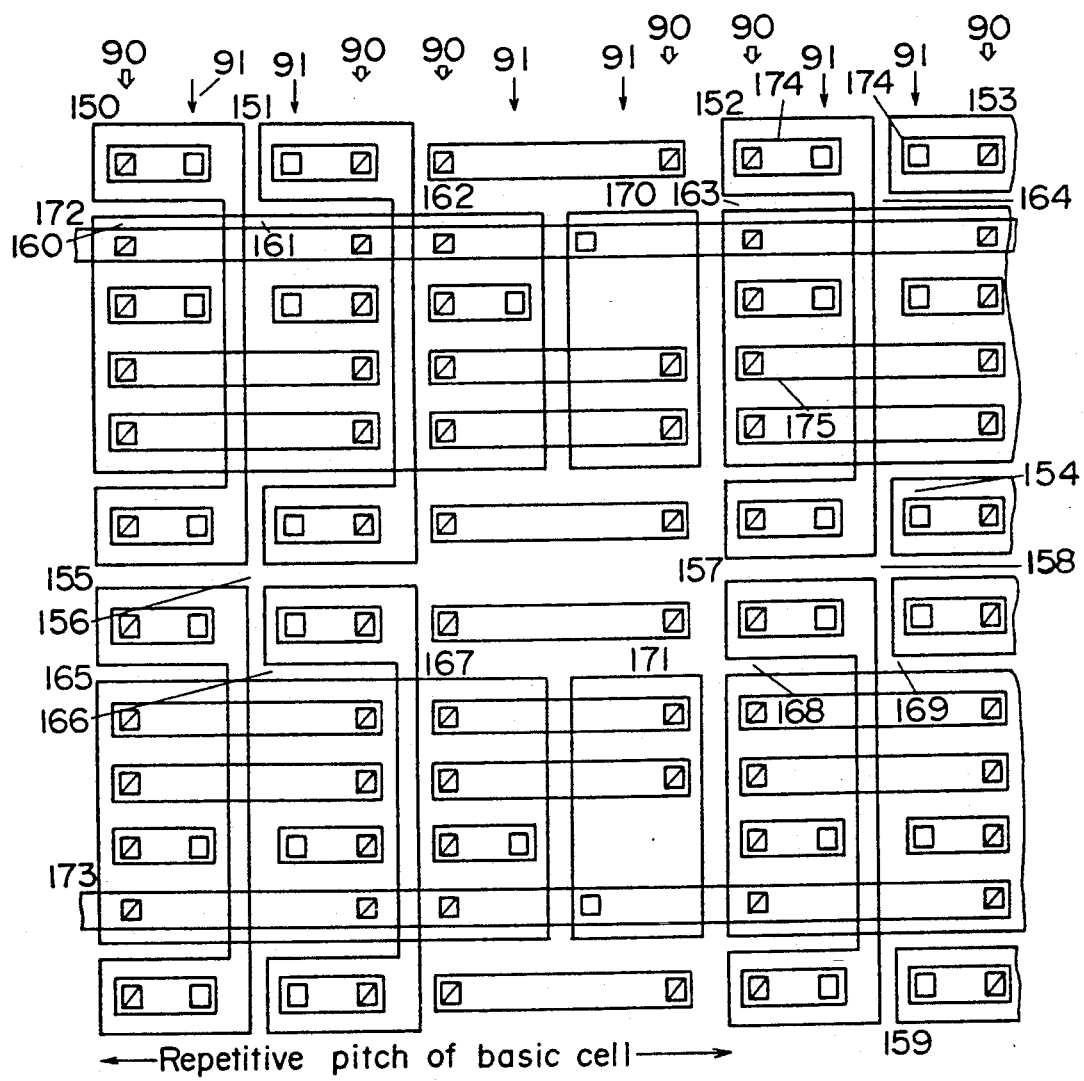

As another example of basic cell differing in structure, a two-input gate isolation structure is explained below. FIG. 17 shows a master layout of two-input gate isolation structure, in which numerals 150 to 154 are gate electrodes of P-chTr, 155 to 159 are gate electrodes of N-chTr, 160 to 162, 163, 164 are P+ diffusion regions, 165 to 167, 168, 169 are N+ diffusion regions, 170 is N+ diffusion region in N-type substrate or N-type islet region, and 171 is P+ diffusion region of N-type substrate or P-type islet region. The diffusion regions 170 and 171 are disposed in order to prevent latch-up and stabilize the AC characteristics, and at the same time the upper parts thereof are utilized as the feed-through regions for passing the second layer wirings. Numeral 172 is a first layer wiring for VDD power source, and 173 is a first layer wiring for VSS power source. Numeral 174 is a first layer wiring piece in the same shape as the one indicated by 88 in FIG. 13, and 175 is a first layer wiring piece in the same shape s the one indicated by 133 in FIG. 15, and two pieces 175, 175 are formed in one basic cell in the lengthwise direction of the first layer wiring piece 175, same as in 133 in FIG. 15.

Figure 18:
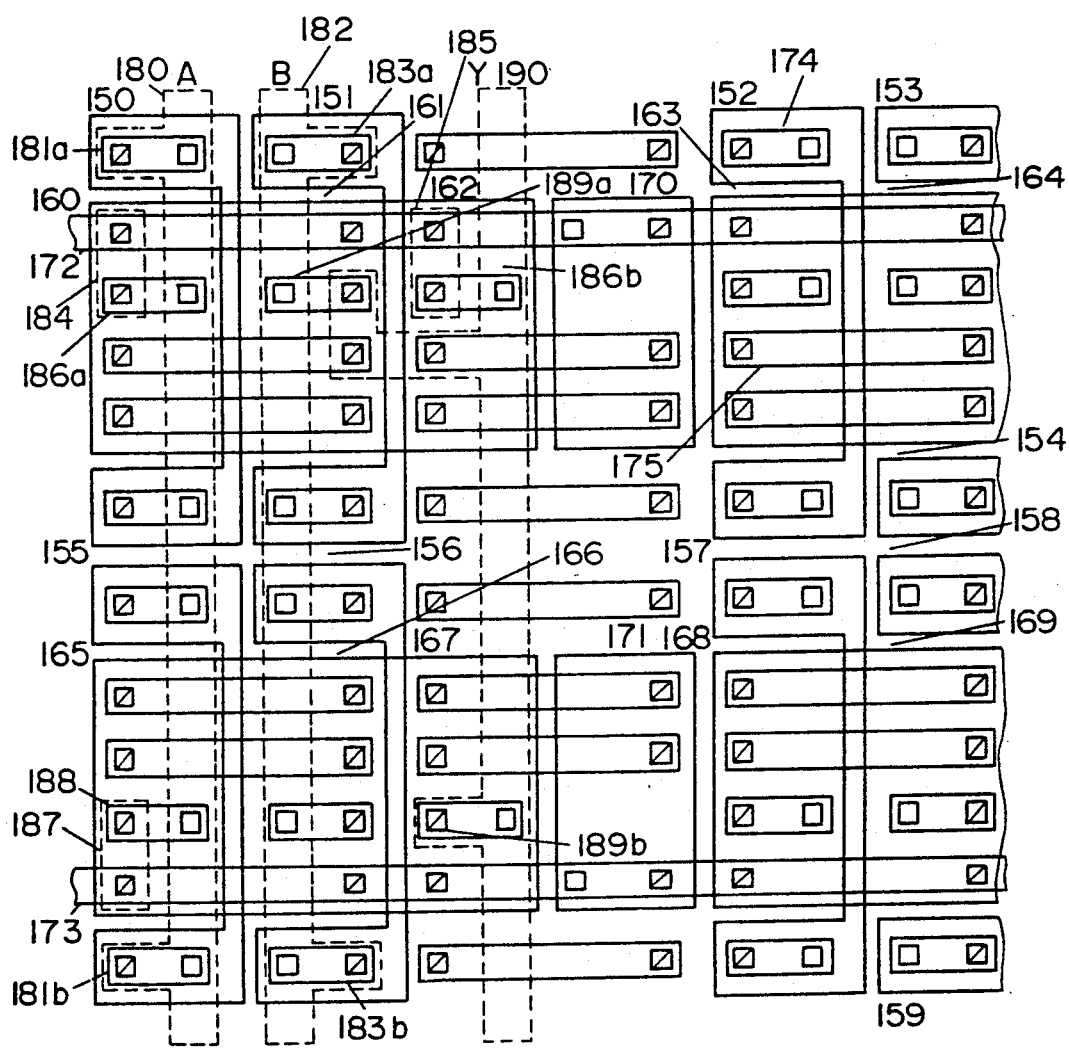

FIG. 18 is a drawing realizing a macrocell on the master slice in the structure shown in FIG. 17, and a two-input NAND gate is composed same as in the preceding example. An input signal A is connected to the gate electrode 150 of P-chTr and the gate electrode 155 of N-chTr through first layer wiring pieces 181a, 181b from the second layer wiring 180, and an input signal B is connected to the gate electrode 151 of P-chTr and the gate electrode 156 of N-chTr through first layer wiring pieces 183a, 183b from the second layer wiring 182. By the second layer wirings 184, 185 and first layer wiring pieces 186a, 186b, P+ diffusion regions 160, 162 are connected to the VDD power source wire 172 to become the source of P-chTr. By the second layer wiring 187 and first layer wiring piece 188, N+ diffusion region 165 is connected to the VSS power source wire 173 to become the source of N-chTr. Then the P+ diffusion region 161 is connected to the second layer wiring 190 through the first layer wiring piece 189a, while the N+ diffusion region 167 is connected to the second layer wiring 190 by way of the first layer wiring piece 189b. As a result, the drain of P-chTr and the drain of N-chTr are mutually connected, and the second layer wiring 190 becomes the output terminal of output signal Y. Thus, the two-input NAND gate is composed on the master slice in the two-input gate isolation structure.

In all embodiments in FIGS. 13 to 18 explained so far, the contact hole on the first one of first layer wiring pieces and the contact hole on the second one of the first layer wiring pieces are formed only on the first track 90 in which the contact holes can be formed. Accordingly, using this first track 90 as the track for feed-through, and the second layer wiring running on the first track 90 can be fed straightly without folding on the way. Therefore, it is not necessary to use any particular region for folding the second layer wiring in the main wiring direction within the basic cell region, and the chip area can be reduced accordingly.

Besides, in any one of the embodiments in FIGS. 13 to 18, since the tracks at both ends of the repetitive pitch of the basic cell are used as the first track 90 for forming contact holes, the second layer wiring for connecting first layer wiring pieces between adjacent basic cells can be set to the shortest. Moreover, it is not necessary to form second layer wiring in the direction orthogonal to the direction of the second one of the first layer wiring pieces adjacent in the longitudinal direction. Hence, this spacing may be set at a clearance so that one second layer wiring in the direction orthogonal to the longitudinal direction may not pass through. In this constitution, the wiring efficiency is raised, and the chip area can be reduced, and the second layer wiring for connecting the adjacent second one of the first layer wiring pieces may be further shortened.

Furthermore, in all embodiments in FIGS. 13 to 18, since the contact holes for connecting each node of the transistor elements and the first one of the first layer wiring pieces are formed only on the second track 91 on which formation of contact holes is prohibited, various logic functions may be realized by forming the second layer wirings on the first track 90 and second track 91 by employing the conventional grid wiring technique.

Moreover, even if the second layer wiring in the direction orthogonal to the first layer wiring pieces cannot be formed between adjacent second pieces of the first layer wiring pieces, since two tracks are independently maintained above the first one of the first layer wiring pieces, wiring is possible nearly at the same degree of freedom as in the conventional two-layer wiring method. Above all, when the second one of the first layer wiring pieces is set in an exact length enough for allowing only two wires of the second layer wiring formed on the first and second tracks to pass while keeping independent electrically, the length of the first one of the first layer wiring pieces can be set to the shortest without sacrificing the degree of freedom of wiring, and accordingly, the length of the second one of the first layer wiring pieces can be shortened. As a result, the wiring efficiency in the cell is enhanced, and the chip area can be reduced.

As shown in the three embodiments in FIGS. 13 to 18, the application of this invention is not limited to the transistor composition of basic cell alone. That is, this invention can be embodied whether the structure of the separation of mutually adjacent macrocells is of gate isolation type or oxide isolation type. Meanwhile, as for the number of inputs of the basic unit cells, two-input type and three-input type are shown in the embodiment, but this invention may be realized in any number of inputs.

In the foregoing embodiments, a CMOS type semiconductor integrated circuit device is illustrated, but this invention can be equally applied into NMOS, PMOS, bipolar, Bi-CMOS, GaAs, ECL and other master slice type integrated circuit devices differing in process or device, in the same manner as in CMOS.

In these embodiments, the two-input NANG is shown in a macrocell example, but it is also possible to compose three-input NAND, buffer, inverter, NOR and others by using this invention.

In the embodiments shown in FIGS. 13 to 18, the basic cell is shown to have four second pieces of the first layer wiring pieces, but it is also possible to compose more complicated circuits such as latch and flip-flop by increasing the number of second pieces of the first layer wiring pieces.

Besides, the fourth embodiment of this invention may be, same as the first to third embodiments, applied to the master slice type integrated circuit device of so-called full surface buried type, in which the cell region is formed on the entire surface of the semiconductor substrate, aside from the master slice integrated circuit device having wiring regions between plural cell regions.

Thus, in the fourth embodiment of this invention, the first layer wiring formed in the master slice step is composed of first pieces of first layer wiring pieces having a through-hole at one end and a contact hole at the other end, and second pieces of first layer wiring pieces having contact holes at both ends, and each contact hole is formed on a first track, on which contact holes can be formed, orthogonally crossing with the first layer wiring pieces. Therefore, the first track may be used as the track for feed-through, on which the second layer wiring can run straightly, and it is not necessary to fold the second layer wiring on the midway in the main wiring direction, while part of whole of the wirings between cells can be realized by using the basic element group pattern on the cell region, so that the increase of the chip area can be suppressed.

Referring now to FIGS. 19 to 25, a fifth embodiment of this invention is described below. The fifth embodiment is intended to realize the final circuit by forming transistor elements almost on the entire surface on a semiconductor substrate, fabricating a master slice by finishing the process up to the steps of forming general-purpose wiring pieces of lower layer thereon and forming through holes thereon, and then wiring only the top layer depending on the individual circuits.

Figure 22:
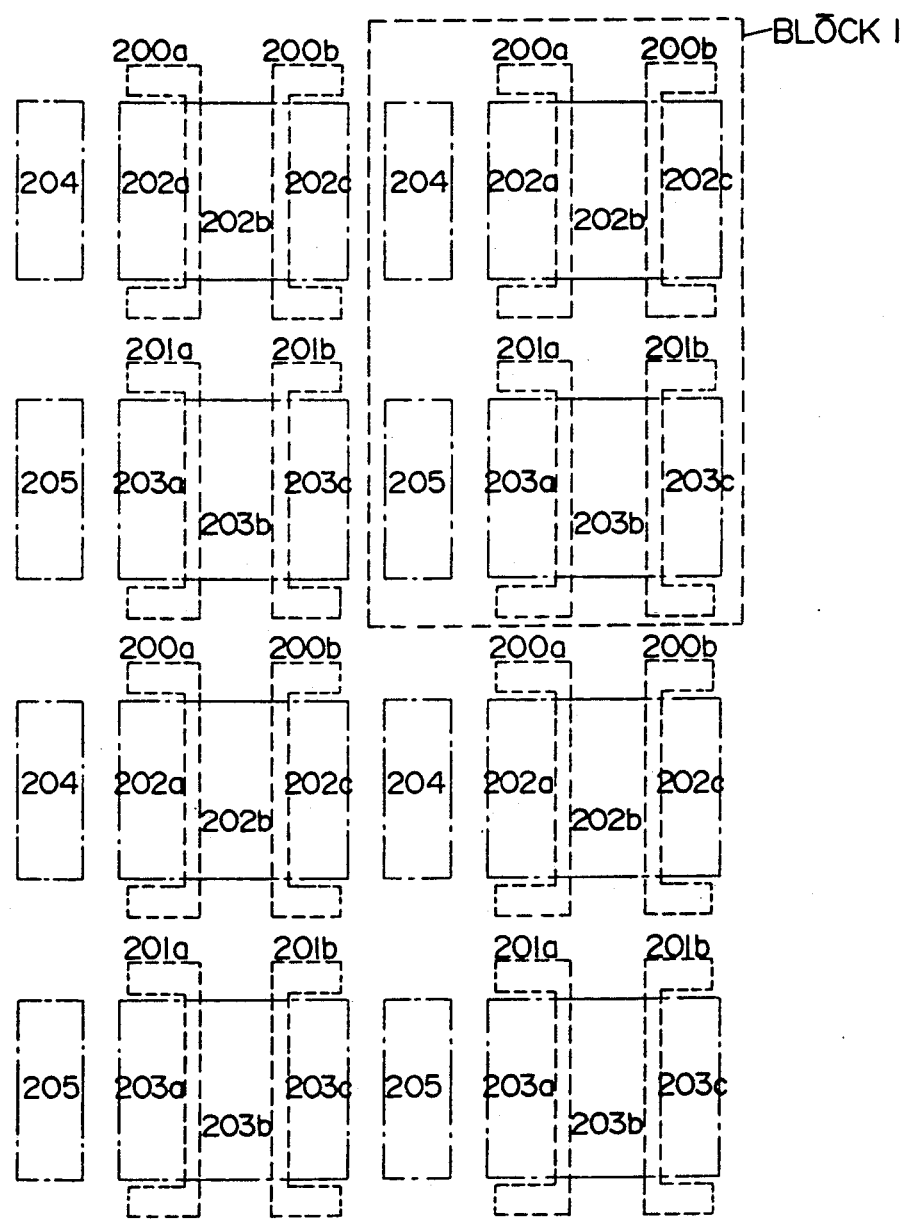

FIG. 22 is a plan view showing a master slice full surface element forming part as an example of a method of employing a master slice in the process up to forming of transistor elements in the prior art, showing a pattern of four basic units of one basic unit range BLOCK 1 of element group formed almost on the entire surface on the semiconductor substrate. In this drawing, 220a and 200b are gate electrodes of P-chTr, 201a and 201b are gate electrodes of N-chTr, 202a, 202b, 202c are source or drain regions of P-chTr, 203a, 203b, 203c are source or drain regions of N-chTr, 204 is an N+ diffusion region in the substrate of P-chTr, and 205 is a P+ diffusion region in the substrate of N-chTr. Two P-chTr transistors and two N-chTr transistors are used as one basic unit of element group, and the product of forming this basic unit almost on the entire surface of the semiconductor substrate is prepared a master slice.

Figure 23:
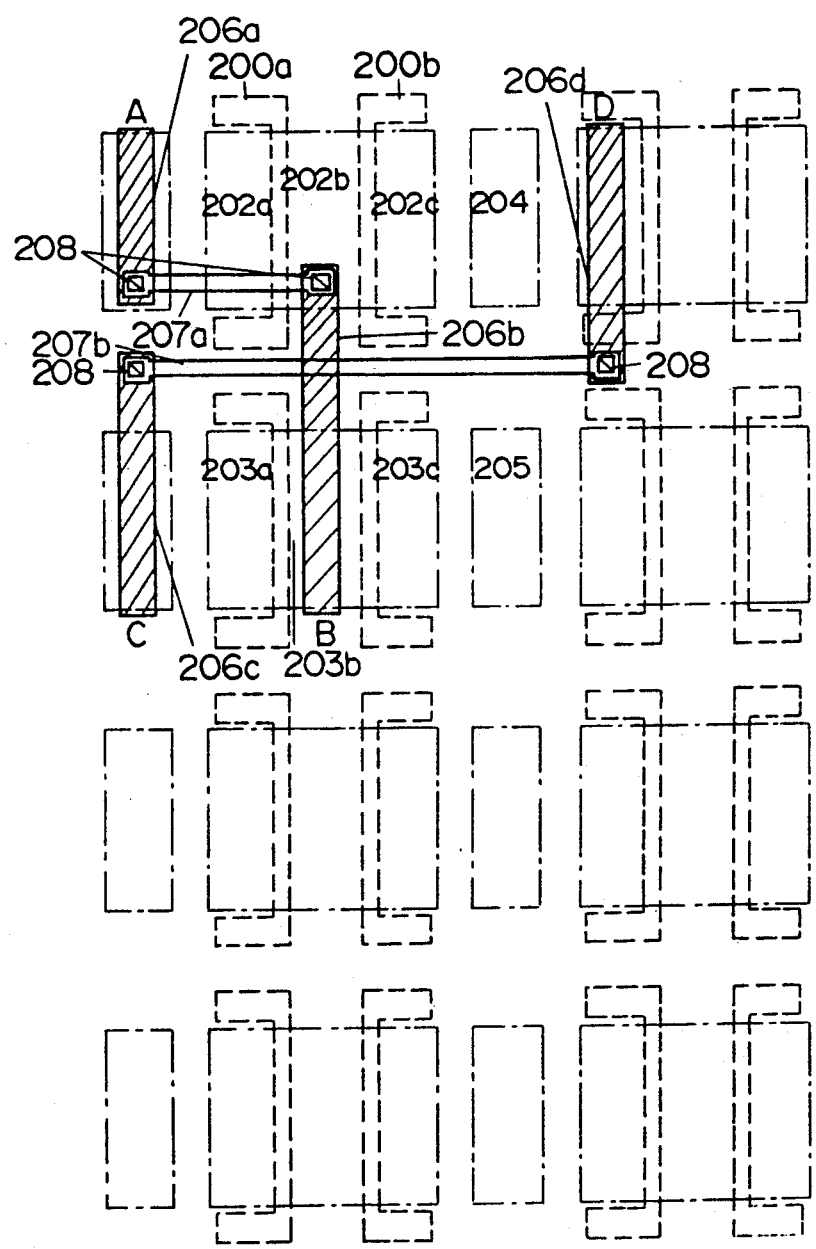

FIG. 23 shows a wiring example for realizing an required circuit in the conventional two-layer wiring method. Here, the technique is explained by a simple wiring example of connecting A and B, and C and D in FIG. 23.

In FIG. 23, 200a to 205 are same as in FIG. 22 and 206a to 206d are wirings formed by second wiring conductive layers. For multilevel crossing of plural different signal wires, the method of crossing the main wiring direction of lower layer wiring and the main wiring direction of upper layer wiring orthogonally is general in the automatic multi-layer wiring, and in FIG. 23 the main wiring direction of the lower layer wiring is set in the horizontal direction, and the main wiring direction of the upper layer wiring is set in the perpendicular direction. In the following explanation, the conductive layer for first wiring means the lower layer wiring layer, and the conductive layer for second wiring indicates the upper layer wiring layer.

In the wiring method in the prior art in FIG. 23, wiring of A and B is achieved by upper layer wiring 206a, lower layer wiring 207a, and upper layer wiring 206b, and wiring of C and D is achieved by upper layer wiring 206c, lower layer wiring 207b, and upper layer wiring 206d, and a necessary connection is realized as the upper layer wiring 206b between A and B, the lower layer wiring 207b between C and D cross with each other at different levels by way of an insulation layer (not shown). Meanwhile, at both ends of the lower layer wirings 207a, 207b, contact holes 208a formed in an insulation layer (not shown) are positioned respectively, and by way of these contact holes 208, the upper layer wirings 206a to 206d and lower layer wirings 207a, 207b are connected.

Figure 24A:
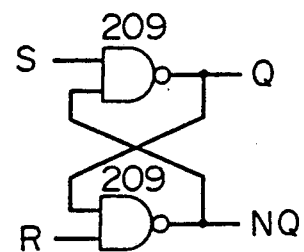
Figure 24B:
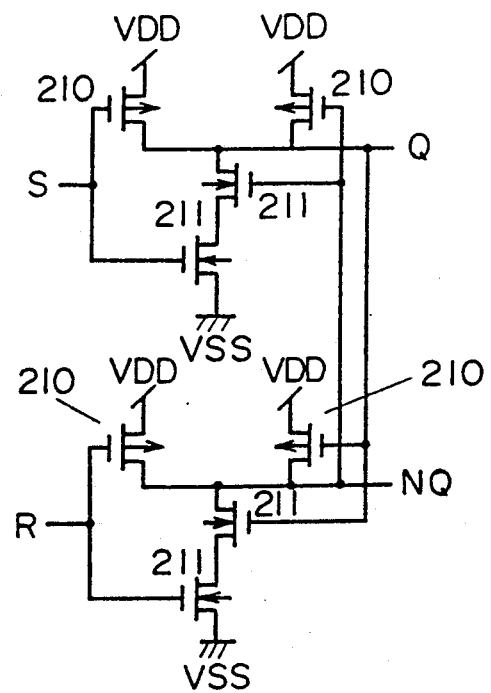
Figure 25:
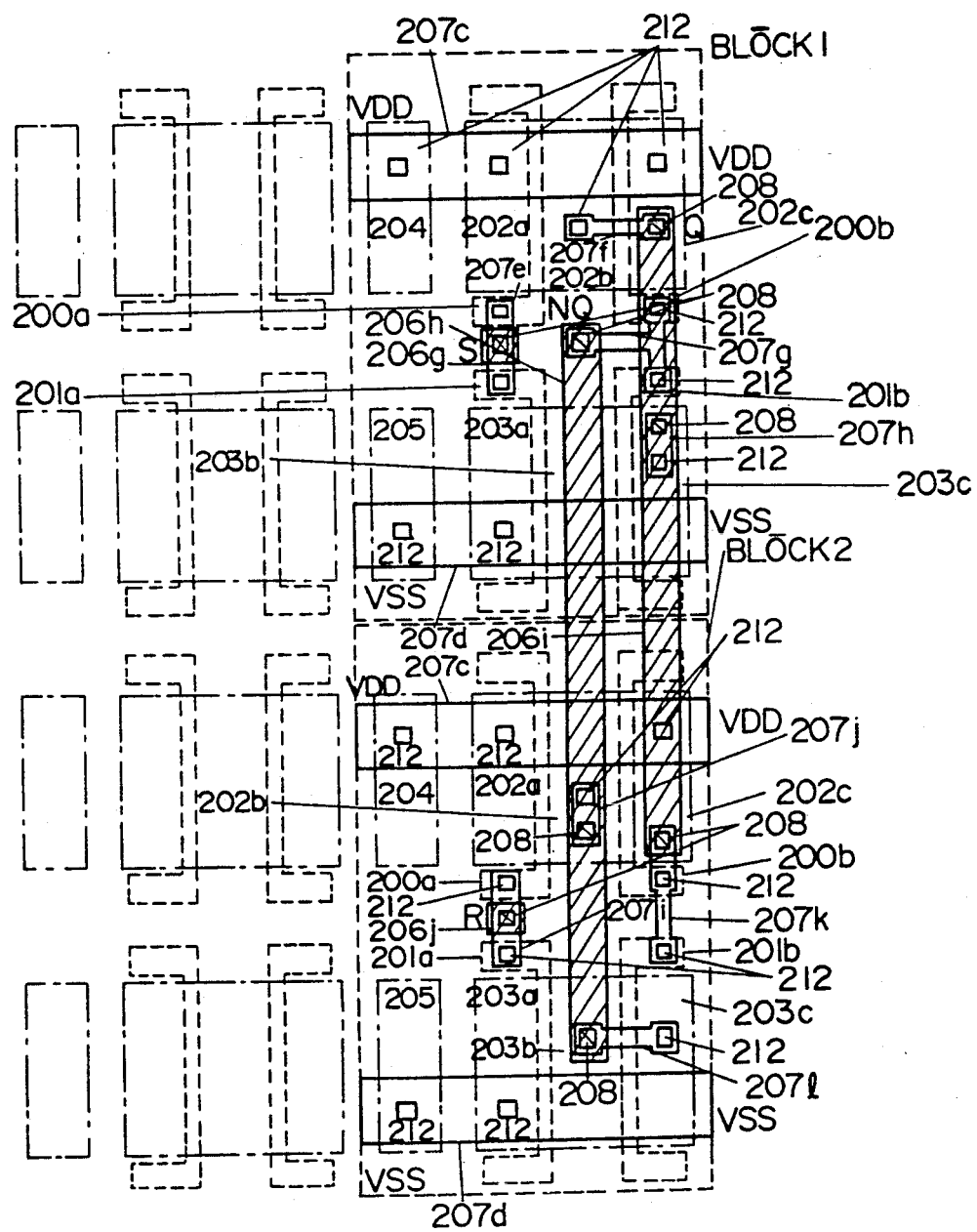

Relating to an example of simple logic circuit, the conventional method of realizing a required circuit on a master slice is explained while referring to FIGS. 24, 25.

FIG. 24 (a) shows an R-S latch circuit illustrated as an example of logic circuit, and FIG. 24 (b) is a drawing to show its transistor configuration. Numeral 209 is a two-input NAND gate, 210 is a P-ch transistor, 211 is an N-ch transistor, S, R are input signals, Q, NQ are output signals, and VDD, VSS are power sources.

FIG. 25 is a plan view of composing the R-S latch circuit in FIG. 24 (b) on the master slice shown in FIG. 22. In FIG. 25, 200a to 208 are same as those in FIG. 22. Numeral 212 is a through hole for connecting each node of the semiconductor element to the first layer wirings, 207e to 207l are first layer wirings, of which 207c is VDD power source wiring, 207d is VSS power source wiring, and 207e to 207l are other signal wirings. Numeral 208 is a contact hole formed in the insulation layer (not shown) for connect the first layer wirings to the second layer wirings, 206g to 206j are second layer wirings formed or said insulation layer, S, R are input signals, Q, NQ are output signals, VDD, VSS are power sources, BLOCK1, BLOCK2 are ranges of one basic unit of element group formed almost on the entire surface of the semiconductor substrate in the master slice process. The R-S latch circuit in FIG. 24 (b) is composed of four P-ch transistors and four N-ch transistors, but in the example in FIG. 25, this R-S latch circuit is composed in the smallest region to satisfy the necessary number of transistors for this composition, that is, in the range of two basic units of BLOCK1 and BLOCK2.

Practical wirings are explained below. The VDD power source is connected to the source regions 202a, 202c of P-ch transistor and N+ diffusion region 204 in the substrate of the P-ch transistor in the basic units of BLOCK1, BLOCK2 respectively by way of the VDD power source wiring 207c and through holes 212. The VSS power source is connected to the source region 203a of N-ch transistor and P+ diffusion region 205 in the substrate of N-ch transistor in the basic units of BLOCK1, BLOCK2 respectively by way of the USS power source wiring 207d and through holes 212. An input signal S is connected to the gate electrode 200a of N-ch transistor and the gate electrode 201a of P-ch transistor in BLOCK1 by way of the second layer wiring 206g, contact hole 208, the first layer wiring 207e and through holes 212 formed on both ends of the first layer wiring 207e. An input signal R is connected to the gate electrode 200a of P-ch transistor and the gate electrode 201a of N-ch transistor in BLOCK2 by way of the second layer wiring 206j, contact hole 208, the first layer wiring 207i and the through holes 212 formed on both ends of the first layer wiring 207i. An output signal Q is delivered from the drain region 202b of P-ch transistor and the drain region 203c of N-ch transistor in BLOCK1 by way of through holes 212, the first layer wiring 207f, 207h, contact holes 208 and the second layer wiring 206i. At the same time, the output signal Q is connected to the gate electrode 200b of P-ch transistor and the gate electrode 201b of N-ch transistor in BLOCK2 by way of through holes 212, the first layer wiring 207k, contact hole 208 and the second layer wiring 206i. An output signal NQ is delivered from the drain region 202b of P-ch transistor and the drain region 203c of N-ch transistor in BLOCK2 by way of through holes 212, the first layer wiring 207j, 207l, contact holes 208 and the second layer wiring 206h. At the same time, the output signal NQ is connected to the gate electrode 200b of P-ch transistor and the gate electrode 201b of N-ch transistor in BLOCK1 by way of through holes 212, the first layer wiring 207g, contact holes 208 and the second layer wiring 206h. By this wiring construction, the R-S latch circuit in the transistor configuration as shown in FIG. 24 (b) can be formed on the master slice.

However, in the conventional wiring method shown in FIGS. 23, 25, four steps are needed until completion of wiring, that is, a step of forming through holes on transistor elements, a step of forming first layer wiring, a step of forming contact holes in the insulation layer between the first layer wiring and the second layer wiring, and a step of processing the second layer wiring. Therefore, if the automatic technology for wiring design by using computer processing is employed, the subsequent wiring processing steps in manufacture cannot be shortened, and the term for delivery after completion of logic design cannot be curtailed.

Figure 19:
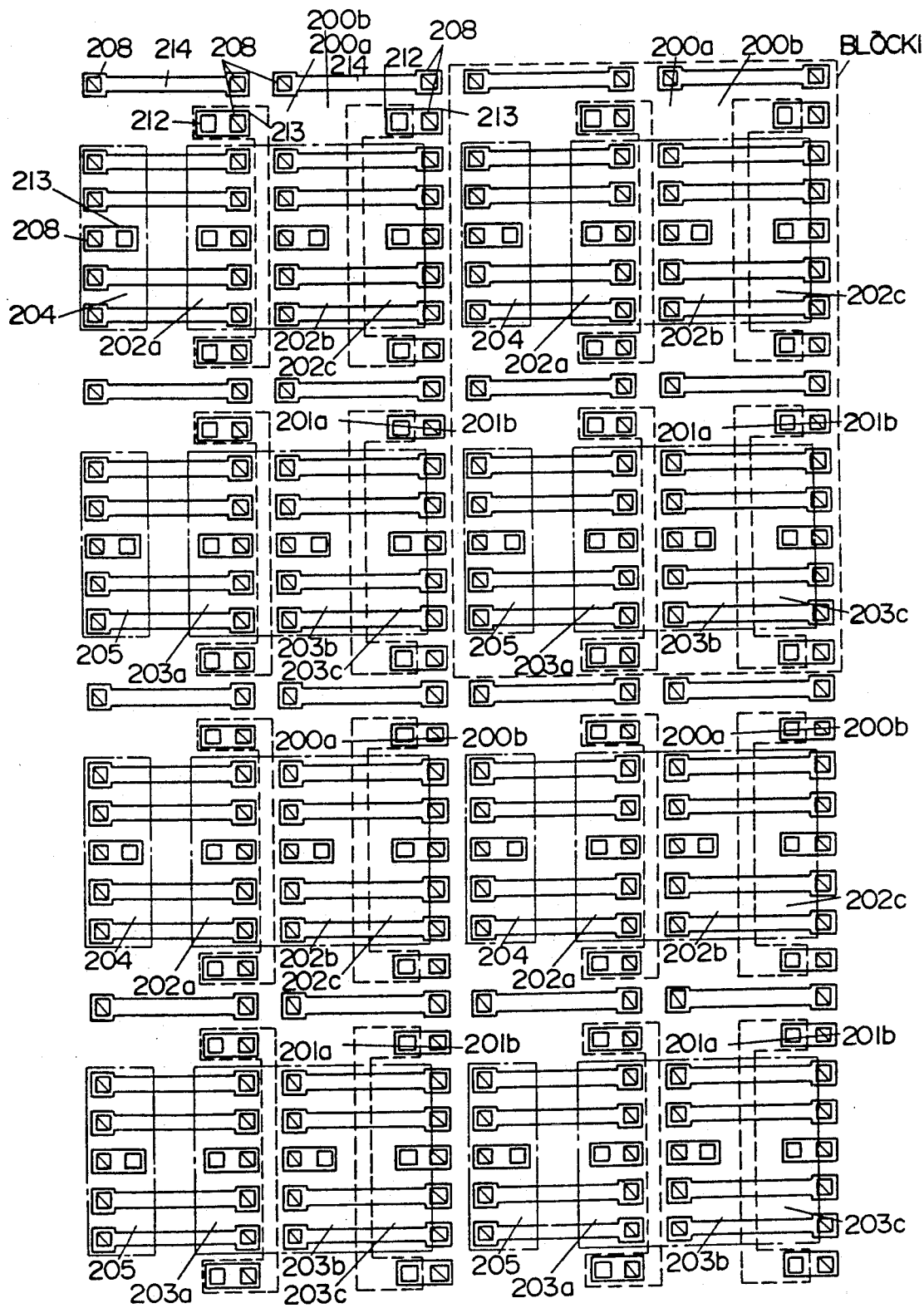
Figure 20:
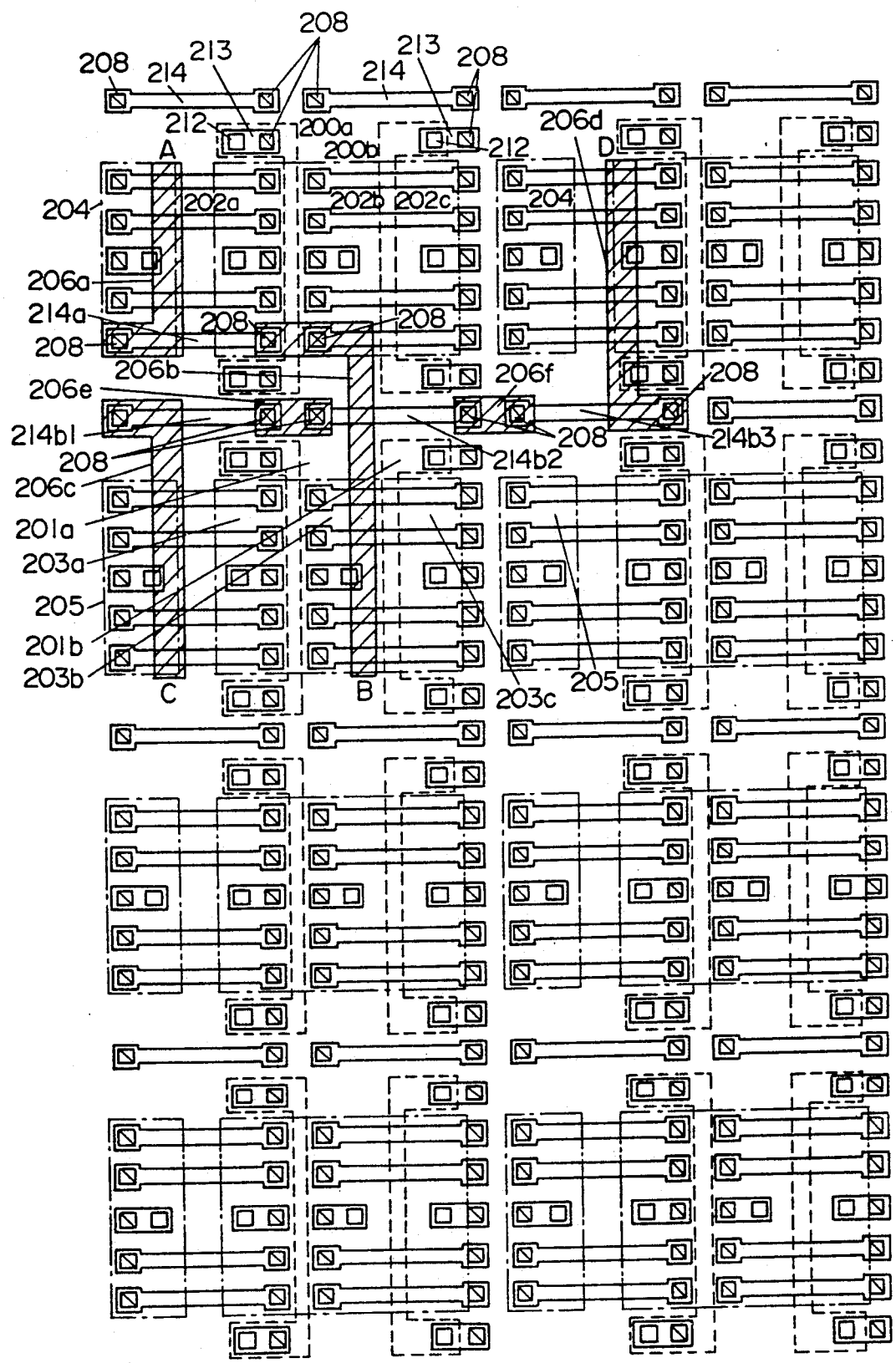
Figure 21:
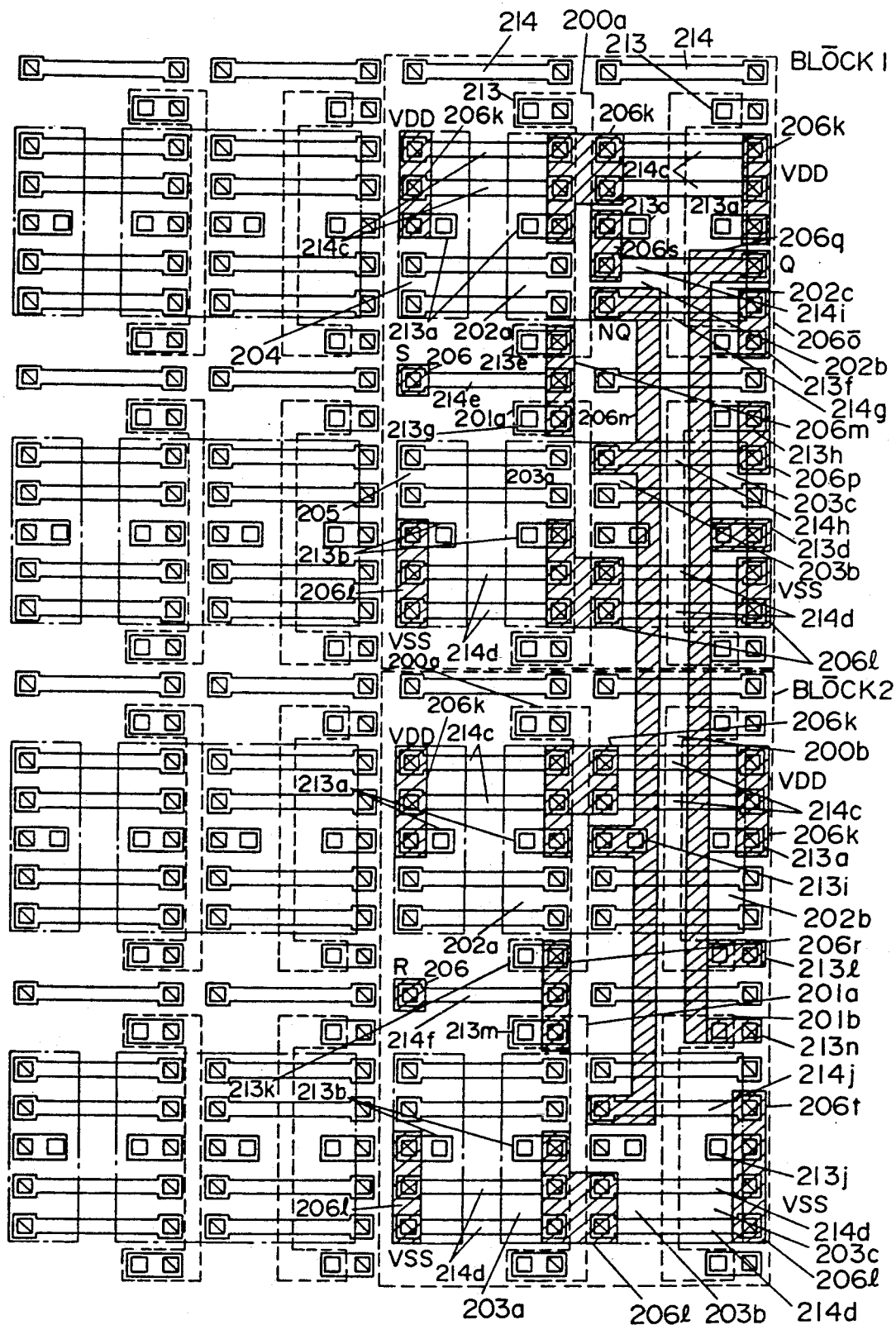

The fifth embodiment of this invention shown in FIGS. 19 to 21 is intended to solve the above-discussed problems in the prior art. That is, the master slice type integrated circuit device and its manufacturing method of this invention capable of notably shortening the period for development and manufacture of required semiconductor integrated circuits are applied in the master slice of the so-called full surface element forming type in which transistor elements are formed almost on the entire surface of the semiconductor substrate.

The fifth embodiment of this invention is described below in conjunction with FIGS. 19 to 21.

FIG. 19 is a plan view showing a full surface element forming part of master slice in the master slice type integrated circuit device according to this invention, showing particularly the pattern of the portion of four basic units of the range of one basic unit, that is BLOCK1, of the element group formed almost on the entire surface of the semiconductor substrate. Numerals 200a to 205 are same as those shown in FIG. 22. Numeral 212 is a through hole into each node of semiconductor elements, 213 is a first one of the first layer wiring pieces, 214 is a second one of the first layer wiring pieces, and 208 is a contact hole formed in the insulation layer (not shown) in order to connect the first layer wirings to the second layer wirings. In this embodiment, a step of forming transistor elements, through holes in the insulation layer on the transistor elements, the first layer wirings on said insulation layer, and contact holes formed in the insulation layer on the first layer wirings, and thus completed assembly is prepared as a master slice. The first one of the first layer wiring piece 213 is provided in order to connect each node of the transistor elements to the second layer wiring by way of through hole 212 and contact hole 208, and the second one of the first layer wiring piece 214 can be connected to the second layer wiring by way of the contact holes 208 at its both ends, and the second layer wirings are designed to be able to cross above the second one of the first layer while keeping independent electrically. In this state of the master slice, the first and second ones of the first layer wiring pieces 213, 214 are electrically independent of other wirings, and a versatile lower layer wiring structure is realized.

This embodiment is hence intended to realize a required integrated circuit by finishing the formation of through holes, the versatile lower layer wiring pieces and contact holes as the master slice manufacturing step, and mutually connecting necessary semiconductor elements in the step of forming the upper (second) layer wirings alone.

A practical wiring example for realizing a required circuit by the upper (second) layer wirings alone is explained below. Here, same as in the conventional example in FIG. 23, a simple technique of wiring for connecting A and B, and C and D in FIG. 20 is illustrated.

FIG. 20 is a plan view showing the wiring method in the master slice method of this embodiment, and it corresponds to the plan view showing the wiring method in the conventional master slice method shown in FIG. 23.

In FIG. 20, wiring of A and B is achieved by way of the first layer wiring piece 214a and the second layer wirings 206a and 206b, and wiring of C and D is achieved by way of the first layer wiring pieces 214b1, 214b2, 214b3, the second layer wirings 206c, 206d for bridge connection in the vertical direction and the second layer wiring pieces 206e, 206f for bridge connection in the horizontal direction, and a required connection is realized by crossing the second layer wiring 206b between A and B and the first layer wiring piece 214b2 between C and D by insulating by the insulating layer therebetween.

As shown in the wiring technique in FIG. 20, according to this embodiment, extending of the second layer wirings in the horizontal direction is achieved by forming bridge connection in the horizontal direction, wiring in the perpendicular direction is achieved by forming the second layer wirings above the first layer wiring pieces 214 in such a manner as not to contact with the contact holes, exchange of horizontal wiring and perpendicular wiring is achieved by forming the second layer wirings including the part above the contact holes, and wiring of high degree of freedom as in the conventional two-layer wiring can be achieved by additionally forming the second layer wirings. Besides, as clear from this embodiment, by forming the first layer wiring pieces and contact holes in regular patterns, automatic wiring processing of the second layer wiring is easily possible.

Next, relating to a simple example of logic circuit, the method of realizing a required circuit on the master slice is explained below.

FIG. 21 shows an example of composing the R-S latch circuit in FIG. 24 (b) on the master slice of the method of this embodiment illustrated in FIG. 19. In FIG. 21, 200a to 208 are same as those shown in FIG. 19, which are preliminarily formed in the master slice process. Numerals 206, 206k to 206t are second layer wirings, and the R-S latch circuit in FIG. 24 (b) is realized by additionally forming only these second layer wirings 206, 206k to 206t on the master slice shown in FIG. 19. Furthermore, S, R are input signals, Q, NQ are output signals, VDD, VSS are power sources, and BLOCK1, BLOCK2 show the range of one basic unit of element group formed almost on the entire surface on the semiconductor substrate in the master slice process. The R-S latch circuit in FIG. 24 (b) is composed of four P-ch transistors and four N-ch transistors, and in the embodiment in which the method of this invention shown in FIG. 21 is applied, the R-S latch circuit is composed in the smallest region satisfying the number of transistors in this configuration, that is, in the range of two basic units of BLOCK1 and BLOCK2.

Practical wirings are explained below. The VDD power source is connected to the source regions 202a, 202c of P-ch transistor and N+ diffusion region 204 in the substrate of the P-ch transistor in the basic units of BLOCK1, BLOCK2 respectively by way of three second layer wirings 206k formed in each BLOCK1 and BLOCK2 respectively, the first one of the first layer wiring piece 213a and the second one of the first layer wiring piece 214c. The VSS power source is connected to the source region 203a of N-ch transistor and the P+ diffusion region 205 in the substrate of N-ch transistor in the basic units of BLOCK1, BLOCK2 respectively by way of the three second layer wirings 206l formed in each BLOCK1 and BLOCK2 respectively, the first one of the first layer wiring piece 213b and the second one of the first layer wiring piece 214d. An input signal S is connected to the gate electrode 200a of P-ch transistor and the gate electrode 201a of N-ch transistor by way of the second layer wirings 206, 206m formed in BLOCK1, the first ones of the first layer wiring piece 213e, 213g and the second one of the first layer wiring piece 214e. An input signal R is connected to the gate electrode 200a of P-ch transistor and the gate electrode 201a of N-ch transistor by way of the second layer wirings 206, 206r formed in BLOCK2, the first ones of the first layer wiring piece 213k, 213m and the second one of the first layer wiring piece 214f. An output signal Q is delivered from the drain region 202b of N-ch transistor and the drain region 203c of N-ch transistor in BLOCK1 by way of the second layer wirings 206q, 206s, the first ones of the first layer wiring piece 213c, 213d and the second one of the first layer wiring piece 214i. At the same time, the output signal Q is connected to the gate electrode 200b of P-ch transistor and the gate electrode 201b of N-ch transistor in BLOCK2 by way of the second layer wiring 206q and the first ones of the first layer wiring piece 213l, 213n. An output signal NQ is delivered from the drain region 202b of P-ch transistor and the drain region 203c of N-ch transistor in BLOCK2 by way of the second layer wirings 206n, 206t, the first ones of the first layer wiring 213i, 213j and the second layer wiring 214j. At the same time, the output signal NQ is connected to the gate electrode 200b of P-ch transistor and the gate electrode 201b of N-ch transistor in BLOCK1 by way of the second layer wirings 206o, 206p, the first ones of the first layer wiring piece 213f, 213h and the second ones of the first layer wiring 214g, 214h. In this wiring configuration, the R-S latch circuit in the transistor construction in FIG. 24 (b) may be composed on the master slice. In the master slice shown in FIG. 19 which is one of the embodiments of this invention, since the power source wiring is not fixed by the lower layer wiring, the lower layer wiring pieces at arbitrary positions may be used for either power source wiring formation or signal wiring formation, which is a structure suited to full surface element formation type.

As evident from the comparison with the result of two-layer wiring using the conventional master slice method shown in FIG. 25, when the master slice of this embodiment is used, it is possible to obtain the same results of wiring connection as the conventional two-layer wiring with a high degree of freedom only by additionally forming the second layer wirings.

In the foregoing explanations, an R-S latch circuit composed of two-input NAND gates was explained as an example of circuit to be composed on the master slice, but since the master slice of this invention is a perfectly versatile type, and the circuit that can be composed on the master slice is not limited to small logic circuits alone, but flip-flop, complicated logic function circuit, so-called MSI function circuit, megamacro function circuit and others can be equally formed. In other words, all the circuits that can be realized in the conventional master slice method comprising two layers of wiring in the later process can be realized by only one additional process of wiring formation of one layer on the master slice of this invention.

Thus, according to the structure and manufacturing method of master slice type integrated circuit device of this invention, since the first step of forming through holes, first layer wiring pieces and contact holes in addition to the formation of transistor elements in the conventional method can be carried out regardless of the features of logic circuits, common master slice can be mass-produced beforehand. What is more, final required circuits can be realized by forming only the second layer wirings depending on the individual circuits, so that the term for development and manufacture of semiconductor integrated circuits may be notably shortened. Besides, fabrication of only one piece enough as for the glass mask used in the darkroom process in semiconductor device manufacture which may be required depending on individual circuits, and it can be manufactured only by the treatment process of the second layer wirings, and hence the development cost becomes low, and therefore, this invention is quite suitable for production of multiple types in small quantities.

In the foregoing embodiments, meanwhile, the fundamental transistor element group was of two-input structure in which two transistors shared the drain, and the structure for separating from the adjacent transistor element group was explained as of oxide isolation type, but the application of this invention does not depend on the transistor composition and separation composition of the fundamental transistor element group. That is, the number of input does not matter for the fundamental transistor element group, and, for example, three-input or four-input type may be applicable. Still more, this invention is also applicable to the transistor element group in the element separation composition of gate isolation type.

In the preceding embodiments, incidentally, 10 channels of the second layer wiring are composed in the horizontal direction in the range of the element group of one basic unit, but the application of this invention is not limited to the number of the channels of the second layer wiring. That is, by increasing or decreasing the number of the channels of the second layer wiring in the range of element group of one unit, the size of the fundamental transistor element can be optimized with respect to the target specification, and the number of channels in the horizontal direction may be optimized depending on the request of the layout system.

In the above embodiments, yet, the second layer wirings are composed in only one length in the horizontal direction, but the application of this invention is not limited to the length of the second layer wirings, and it may be possible to composed by mixing second layer wirings differing in length.

Moreover, in the embodiments above, the CMOS type semiconductor integrated circuits are mentioned, but this invention may be similarly embodied in NMOS, PMOS, bipolar, Bi-CMOS, GaAs, ECL, and other master slice type integrated circuit devices differing in process or device, exactly in the same manner as in the CMOS type.

In the foregoing embodiments shown in FIGS. 19 to 21, transistor elements were mentioned as the semiconductor elements to be formed almost on the entire surface of the semiconductor substrate, but the application of this invention is not limited to the transistor elements alone. In other words, as far as the semiconductor elements can be formed on a semiconductor substrate, everything is applicable. For example, besides transistor elements, capacitive elements and resistance elements are applicable. Furthermore, this invention is also applicable to the so-called analog master slice type integrated circuit device mixing the transistor elements, capacitive elements, resistance elements, and others.

Although the master slice type integrated circuit device wiring in two conductive layers for wiring is mentioned in the above embodiments, the effects to this invention are not limited by the number of wiring layers. That is, this invention is applicable to the master slice type integrated circuit device with three or more wiring layers, and in such case the first conductive layer for wiring in the appended claims may be either the conductive layer wiring immediately beneath the final wiring layer or a further lower conductive layer for wiring, and it is similarly effective to shorten the term of manufacture. Furthermore, similar effect will be obtained when the wiring structure of this invention is repeatedly applied two or more times in the master slice type integrated circuit device having four or more layers of wiring.

This invention is thus intended to realize a final circuit by wiring only the top layer depending on the individual circuits, by forming a master slice by finishing the process up to formation of lower layer wiring pieces and contact holes formed in the insulation layer thereon on an already diffused semiconductor substrate. Therefore, up to the step of forming contact holes, it is possible to manufacture regardless of the the circuits, and mass production is possible, and the final products can be completed by wiring onto the top layer depending on the requirements of the users. Accordingly, it is applicable to a wide variety of products, and the term for development and manufacture can be greatly shortened.

While specific embodiments of the invention has been illustrated and described herein, it is realized that modifications and changes will occur to those skilled in the art. It is therefore to be understood that the appended claims are intended to cover all modifications and changes as fall within the true spirit and scope of the invention.

We claim:

1. A method of manufacturing a master slice type integrated circuit device comprising:
    a first step of fabricating a master slice by forming specified diffusion regions for transistor elements at specified positions in a semiconductor substrate, each of said transistor elements having a gate electrode, forming a first insulation layer with plural through holes on said semiconductor substrate, forming plural first layer wiring pieces all extending in a same direction which is orthogonal to a longitudinal direction of said gate electrodes of said transistor elements at specified intervals on said first insulation layer, connecting said plural first layer wiring pieces to said diffusion regions using through holes selected from among said plural through holes on said plural first layer wiring pieces, and
    a second step of forming second layer wirings on said second insulation layer and connecting said second layer wirings to said first layer wiring pieces using contact holes selected from among said plural contact holes so that said diffusion regions are mutually connected by said through holes, said first layer wiring pieces, said contact holes and said second layer wirings.

2. A method of manufacturing a master slice type integrated circuit device comprising:
    a first step of fabricating a master slice by:
    a first process of forming specified diffusion regions for transistor elements at specified positions in a semiconductor substrate and forming a first insulation layer on said semiconductor substrate, each of said transistor elements having a gate electrode;
    a second process of forming plural first layer wiring pieces all extending in a same direction which is orthogonal to a longitudinal direction of said gate electrodes of said transistor elements on said first insulation layer and forming a second insulation layer with plural contact holes on said plural first layer wiring pieces;
    a third process of overlaying at least one laminate layer on said second insulation layer, wherein each of said at least one laminate layer is composed of plural second layer wiring pieces and a third insulation layer with plural contact holes on said plural second layer wiring pieces, and
    a fourth process of connecting said plural first wiring pieces to said plural second wiring pieces located in said at least one laminate layer by said plural contact holes formed in said second insulation layer and said third insulation layer located in said at least one laminate layer; and,
    a second step of forming a highest layer wiring on said third insulation layer located in the highest of said at least one laminate layer and connecting said highest layer wiring to said second layer wiring pieces immediately beneath said highest layer wiring by said contact holes formed in said third insulation layer in the highest laminate layer so that said plural diffusion regions are connected by said first and second layer wiring pieces, said the highest layer wiring and said contact holes.

3. A method of manufacturing a master slice type integrated circuit device comprising:
    a first step of fabricating a master slice by:
    a first process of forming at least one wiring region and basic cell region in a semiconductor substrate, and, in said cell region, forming specified diffusion regions for transistor elements at specified positions, each of said transistor elements having a gate electrode;
    a second process of forming a first insulation layer on said semiconductor substrate;
    a third process of forming plural first layer wiring pieces all extending in a same direction which is orthogonal to a longitudinal direction of said gate electrodes of said transistor elements at specified intervals on said first insulation layer;
    a fourth process of forming a second insulation layer on said first layer wiring pieces, said second insulation layer having plural contact holes positioned in at least one end of each of said first layer wiring pieces;
    wherein said plural first layer wiring pieces are regularly arranged so that said contact holes may be arrayed on a straight line along the main wiring direction of second layer wirings regardless of said wiring regions and said basic cell region;

a second step of forming said second layer wirings on said second insulation layer and connecting said second layer wirings to said plural first layer wiring pieces by contact holes selected from among said plural contact holes.

4. A method of manufacturing a master slice type integrated circuit device comprising:

a first step of fabricating a master slice by:

a first process of forming at least one wiring region and basic cell region in a semiconductor substrate, and, in said basic cell region, forming specified diffusion regions for transistor elements at specified positions, each of said transistor elements having a gate electrode;

a second process of forming a first insulation layer on said semiconductor substrate;

a third process of forming plural first layer wiring pieces all extending in a same direction which is orthogonal to a longitudinal direction of said gate electrodes of said transistor elements at specified intervals on said first insulation layer;

a fourth process of forming a second insulation layer on said first layer wiring pieces, said second insulation layer having plural contact holes positioned in both ends of each of said first layer wiring pieces;

wherein each of said first layer wiring pieces has a specified shape and sufficient length for passing at least one second layer wiring, and said plural first layer wiring pieces are regularly arranged so that one end contact hole row and the other end contact hole row on said plural first layer wiring pieces may be arrayed on a straight line along the main wiring direction of said second layer wirings respectively regardless of said wiring regions and said basic cell region;

a second step of forming said second layer wirings on said second insulation layer and connecting said second layer wirings to said plural first layer wiring pieces by contact holes selected from among said plural contact holes.

5. A method of manufacturing a master slice type integrated circuit device comprising:

a first step of fabricating a master slice by:

a first process of forming at least one basic cell region in a semiconductor substrate;

a second process of forming a first insulation layer on said semiconductor substrate;

a third process of forming plural through holes in said first insulation layer;

a fourth process of forming a plural first layer wiring pieces of a first shape having a length for passing at least one second layer wiring keeping electrically independent and plural first layer wiring pieces of a second shape;

a fifth process of forming a second insulation layer on said first layer wiring pieces of said first shape and of said second shape;

a sixth process of forming plural contact holes in said second insulation layer, said contact holes being positioned on both ends of said each first layer wiring piece of said first shape and on at least one end of each of said first layer layer wiring pieces of said second shape;

wherein said plural first layer wiring prices of said first shape and of said second shape are regularly arranged so that one end or the other end contact holes of said plural first layer wiring pieces of said first shape and the contact holes of said plural first layer wiring pieces of said second shape may be arrayed on a straight line along the main wiring direction of second layer wirings in said basic cell region;

a second step of forming said second layer wirings on said second insulation layer and connecting said second layer wirings to said plural first layer wiring pieces of said first shape and of said second shape by contact holes selected from among said plural contact holes.

* * * * *